(12) United States Patent
Iwasawa et al.

(10) Patent No.: US 10,759,710 B2
(45) Date of Patent: Sep. 1, 2020

(54) COMPOSITE STRUCTURE, SEMICONDUCTOR MANUFACTURING APPARATUS AND DISPLAY MANUFACTURING APPARATUS PROVIDED WITH COMPOSITE STRUCTURE

(71) Applicant: TOTO LTD., Kitakyushu-shi, Fukuoka (JP)

(72) Inventors: Junichi Iwasawa, Kitakyushu (JP); Hiroaki Ashizawa, Kitakyushu (JP); Takuma Wada, Kitakyushu (JP); Ryoto Takizawa, Kitakyushu (JP); Toshihiro Aoshima, Kitakyushu (JP); Yuuki Takahashi, Kitakyushu (JP); Atsushi Kinjo, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 0 days.

(21) Appl. No.: 16/296,934

(22) Filed: Mar. 8, 2019

(65) Prior Publication Data
US 2019/0276368 A1    Sep. 12, 2019

(30) Foreign Application Priority Data

Mar. 8, 2018   (JP) .................................. 2018-042030
Mar. 8, 2018   (JP) .................................. 2018-042047
(Continued)

(51) Int. Cl.
*B32B 9/00*  (2006.01)
*C04B 35/505*  (2006.01)
(Continued)

(52) U.S. Cl.
CPC ............ *C04B 35/505* (2013.01); *C01B 11/24* (2013.01); *C01F 7/02* (2013.01); *C01F 17/206* (2020.01);
(Continued)

(58) Field of Classification Search
None
See application file for complete search history.

(56) References Cited

U.S. PATENT DOCUMENTS

2006/0159946 A1*   7/2006   Iwasawa .............. B82Y 30/00
                                                                  428/620
2006/0178010 A1    8/2006   Iwasawa et al.
(Continued)

FOREIGN PATENT DOCUMENTS

JP    2012-017527 A    1/2012
KR    20170077830 A    7/2017
(Continued)

OTHER PUBLICATIONS

Nihon Kagaku-kaishi, 1979, No. 8, pp. 1106-1108.

*Primary Examiner* — Seth Dumbris
*Assistant Examiner* — Kim S. Horger
(74) *Attorney, Agent, or Firm* — Carrier Blackman & Associates, P.C.; Joseph P. Carrier; William D. Blackman

(57) ABSTRACT

Disclosed is provision of a ceramic coat having an excellent low-particle generation as well as a method for assessing the low-particle generation of the ceramic coat. A composite structure including a substrate and a structure which is formed on the substrate and has a surface, wherein the structure includes a polycrystalline ceramic and the composite structure has luminance Sa satisfying a specific value calculated from a TEM image analysis thereof, can be suitably used as an inner member of a semiconductor manufacturing apparatus required to have a low-particle generation.

12 Claims, 37 Drawing Sheets

(30) Foreign Application Priority Data

| Jun. 21, 2018 | (JP) | 2018-118281 |
| Jul. 6, 2018 | (JP) | 2018-129261 |
| Jul. 6, 2018 | (JP) | 2018-129262 |
| Jan. 25, 2019 | (JP) | 2019-010708 |

(51) Int. Cl.

| *C01B 11/24* | (2006.01) |
| *C01F 7/02* | (2006.01) |
| *C01G 25/02* | (2006.01) |
| *C04B 35/622* | (2006.01) |
| *H01J 37/28* | (2006.01) |
| *H01L 21/67* | (2006.01) |
| *H01L 21/687* | (2006.01) |
| *C01F 17/206* | (2020.01) |
| *C01F 17/265* | (2020.01) |

(52) U.S. Cl.
CPC ............ *C01F 17/265* (2020.01); *C01G 25/02* (2013.01); *C04B 35/62222* (2013.01); *H01J 37/28* (2013.01); *H01L 21/67069* (2013.01); *H01L 21/68757* (2013.01); *C01P 2002/01* (2013.01); *C01P 2002/60* (2013.01); *C01P 2004/04* (2013.01); *C01P 2006/80* (2013.01); *C04B 2235/3225* (2013.01); *C04B 2235/72* (2013.01); *C04B 2235/781* (2013.01); *C04B 2235/9669* (2013.01); *H01J 2237/2802* (2013.01)

(56) References Cited

U.S. PATENT DOCUMENTS

| 2008/0274333 A1* | 11/2008 | Iwasawa | C23C 16/4404 428/141 |
| 2016/0333471 A1 | 11/2016 | Lee et al. | |
| 2017/0152189 A1* | 6/2017 | Iwasawa | C04B 41/87 |
| 2018/0301321 A1 | 10/2018 | Iwasawa | |

FOREIGN PATENT DOCUMENTS

| WO | WO-2015198998 A1 * | 12/2015 | ........... C04B 35/505 |
| WO | 2017/109975 A1 | 6/2017 | |

* cited by examiner

Fig. 3D
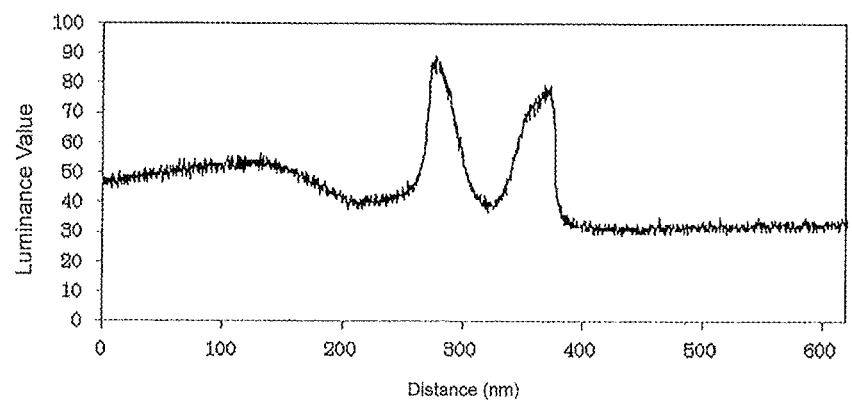
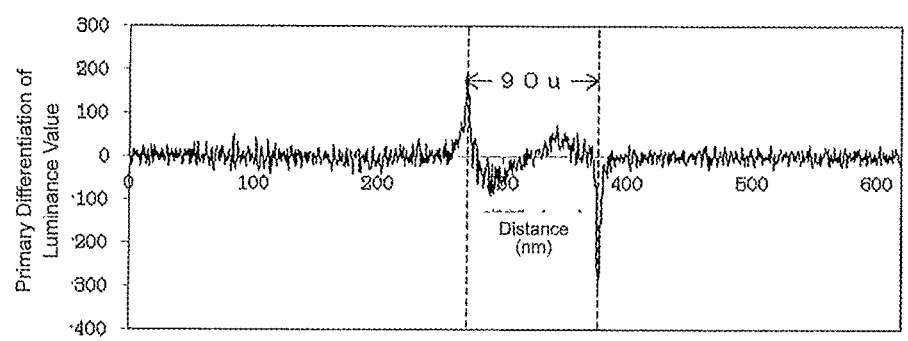
Fig. 3E

Fig. 5A
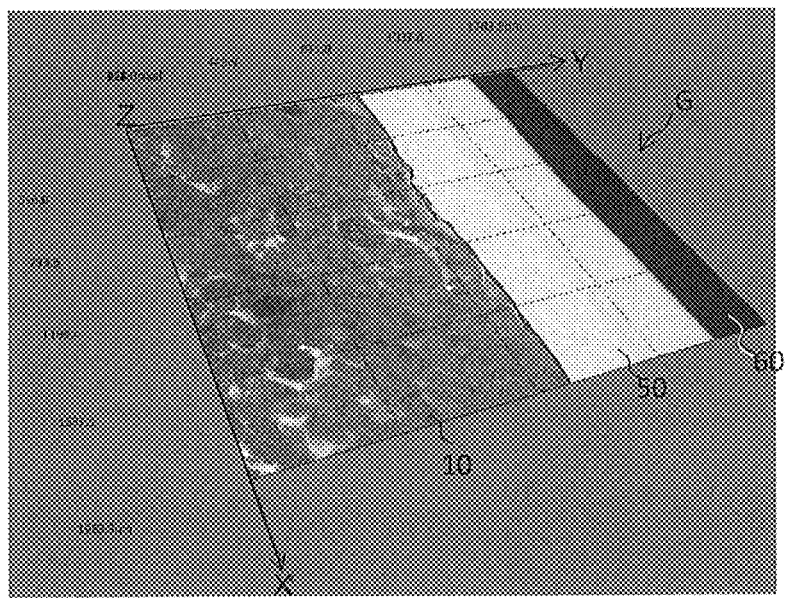
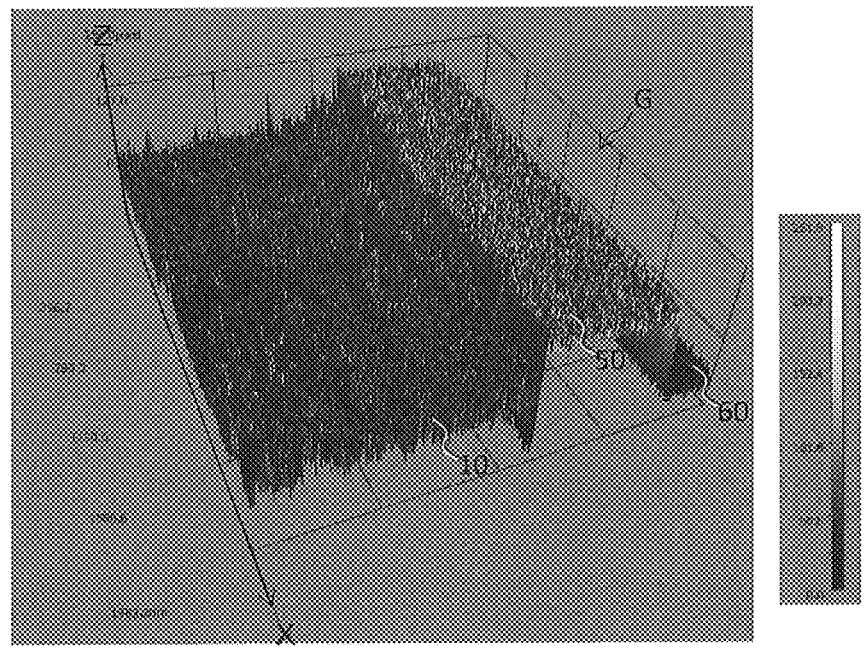
Fig. 5B

Fig. 6A
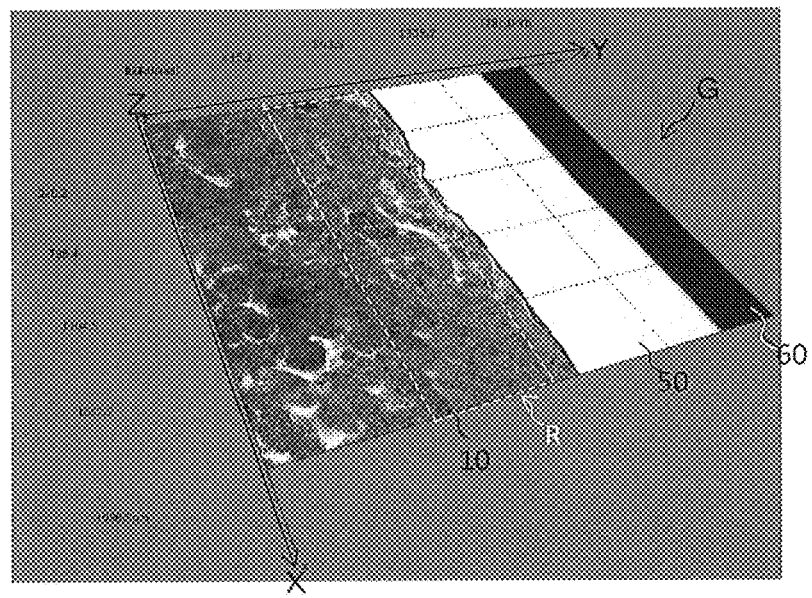
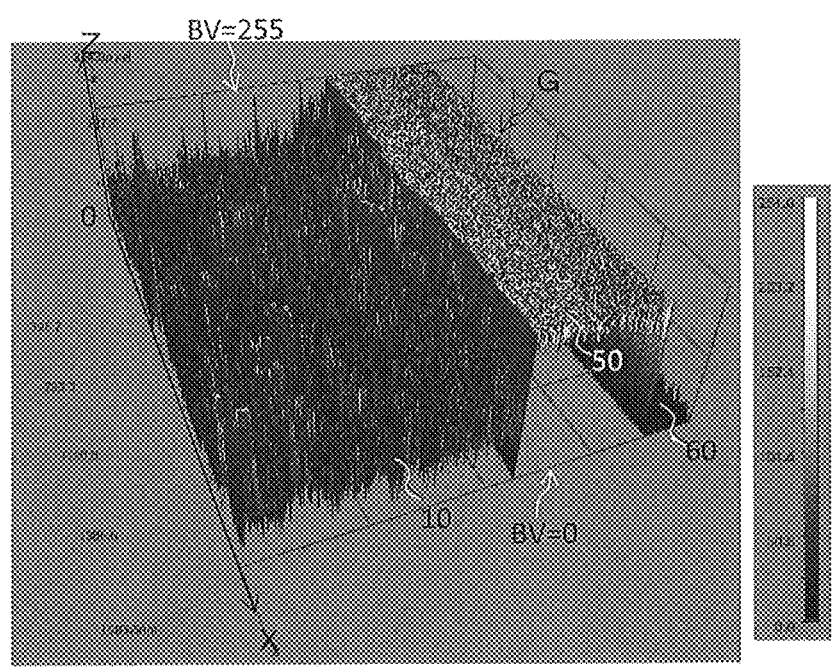
Fig. 6B

Fig. 7A
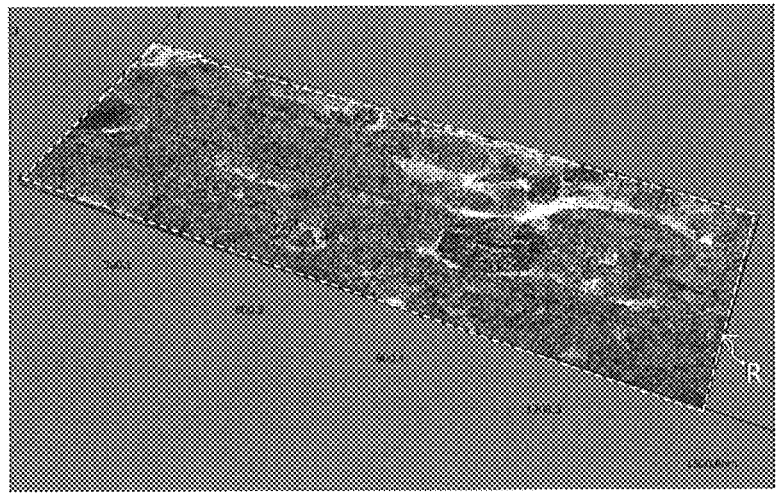
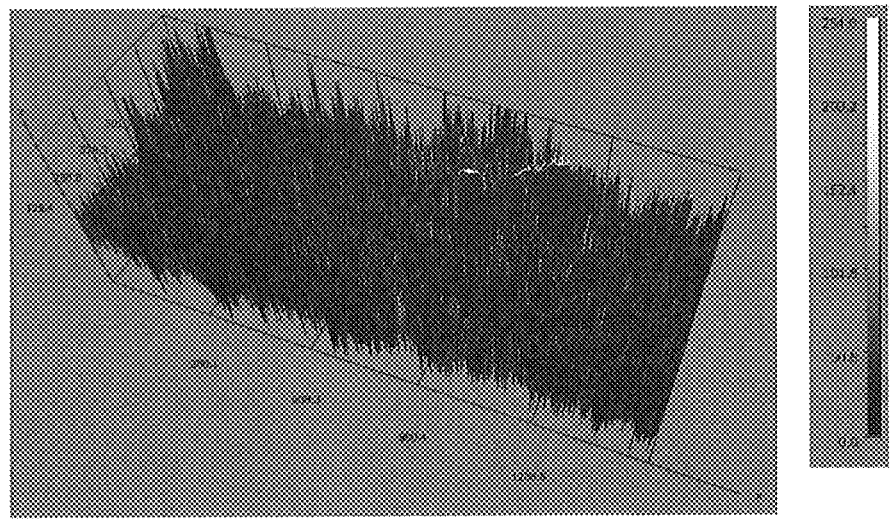
Fig. 7B

Fig. 7C
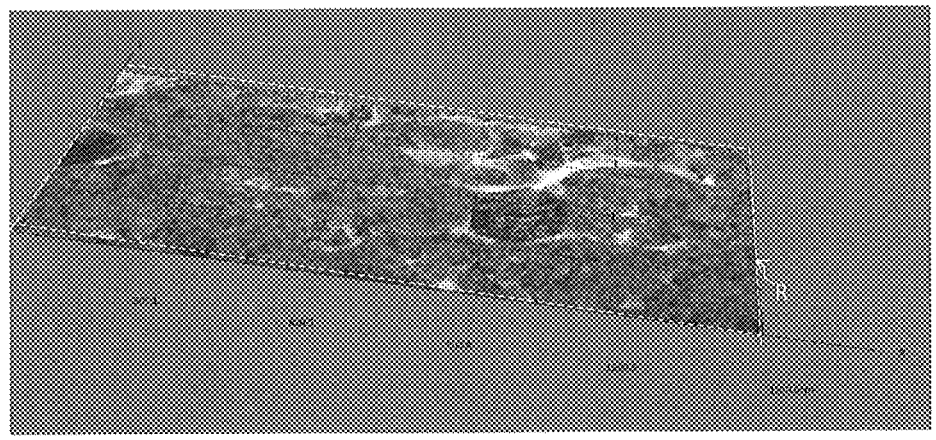
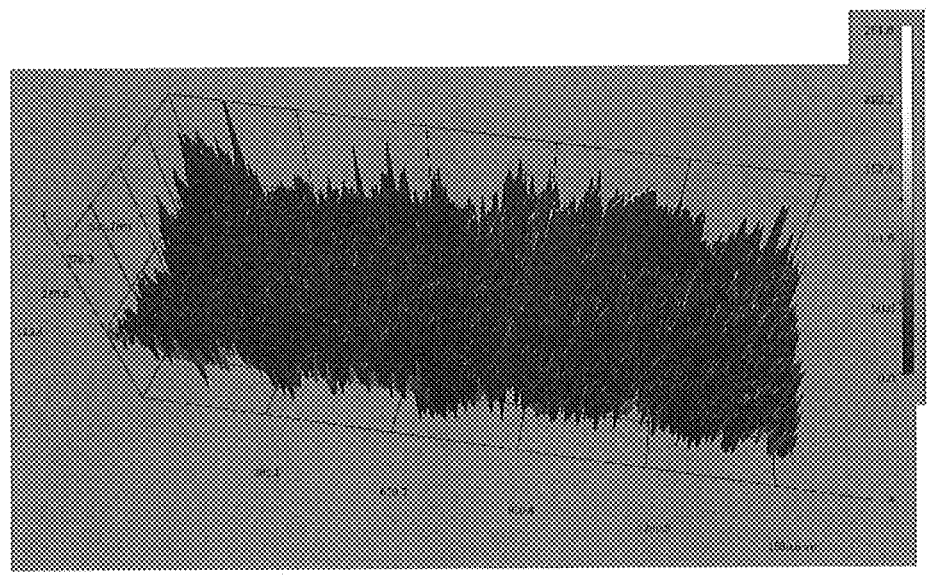
Fig. 7D

Fig. 12A
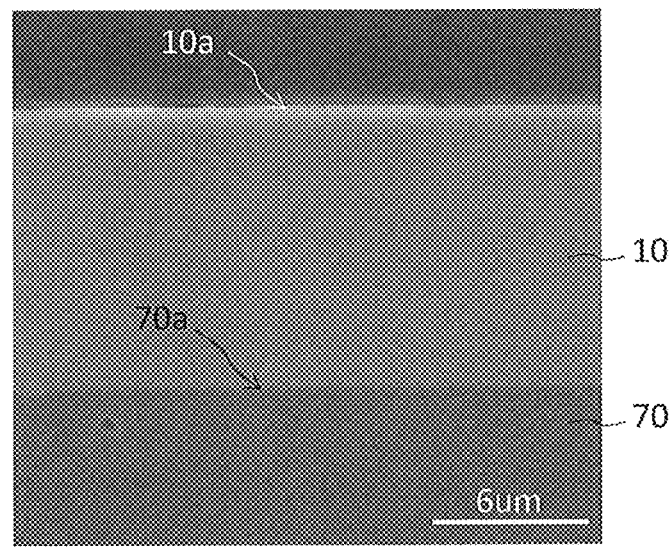
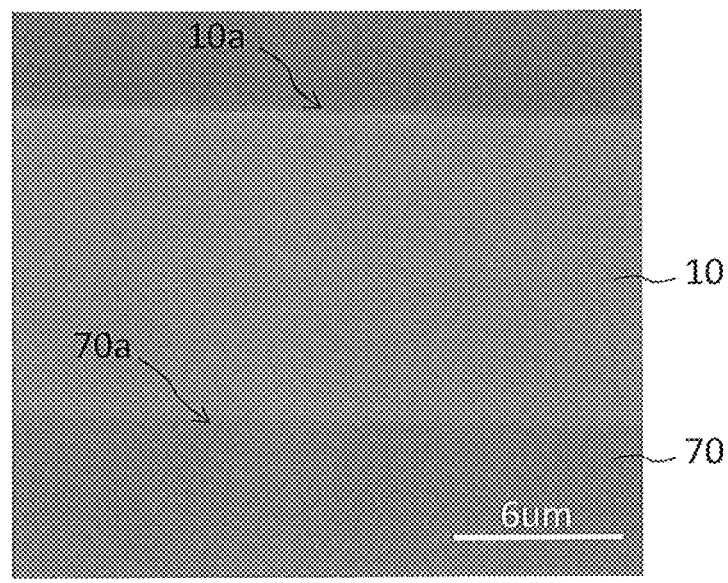
Fig. 12B

Fig. 12C
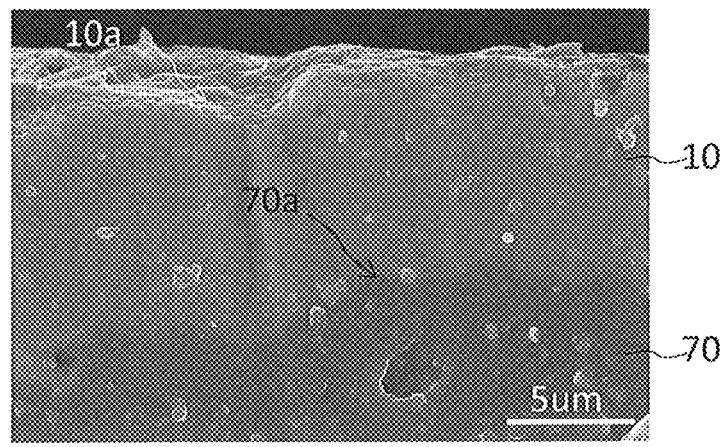
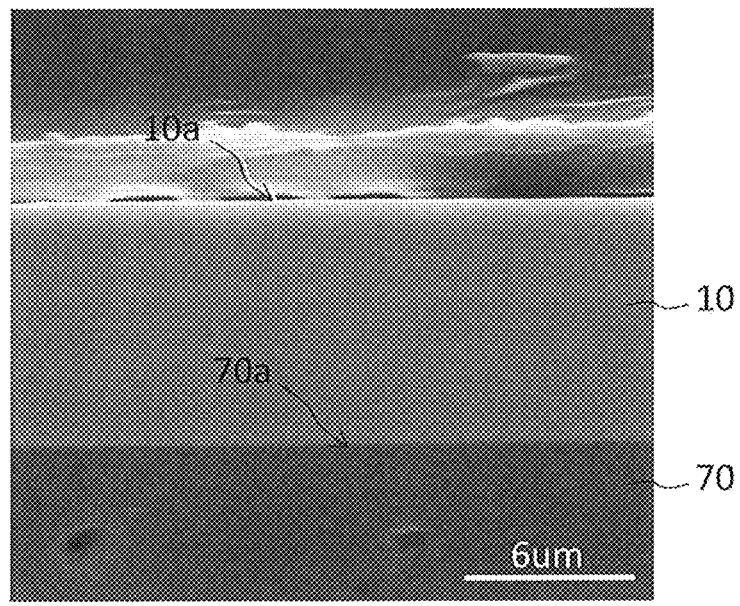
Fig. 12D

Fig. 14A
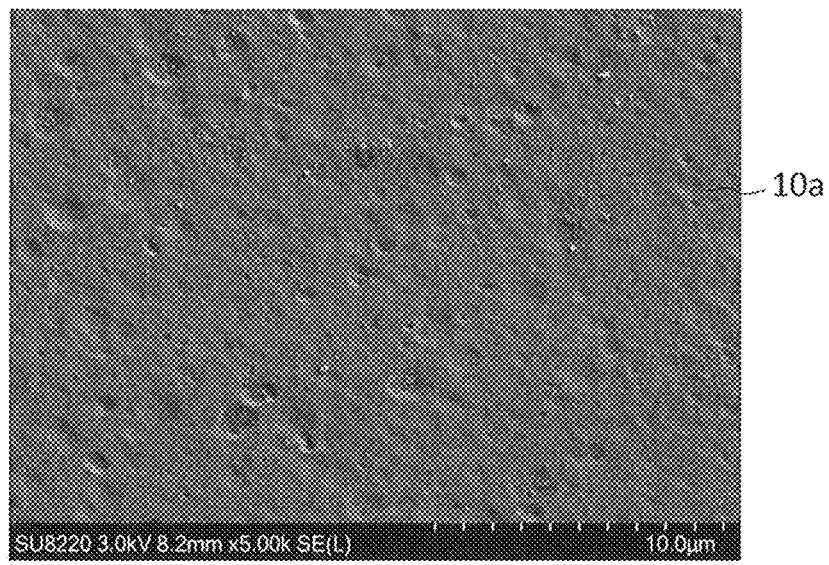
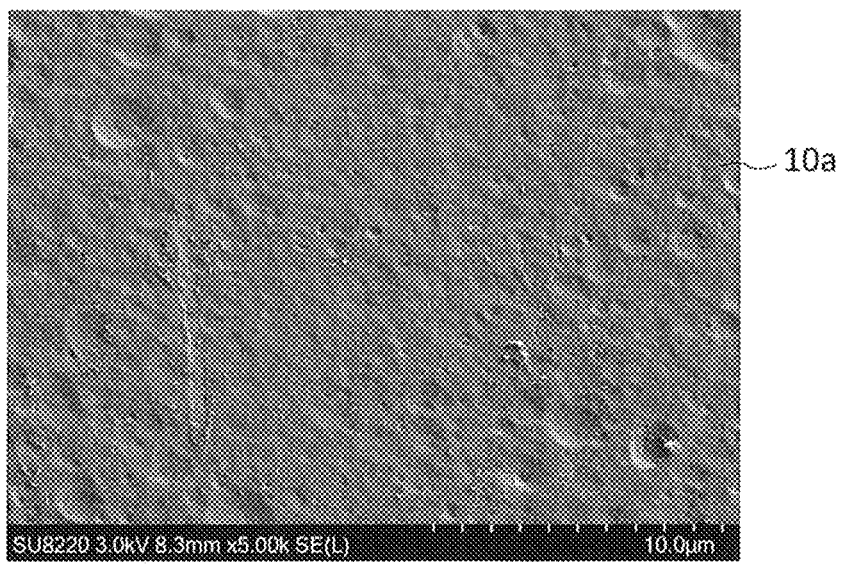
Fig. 14B

Fig. 14C
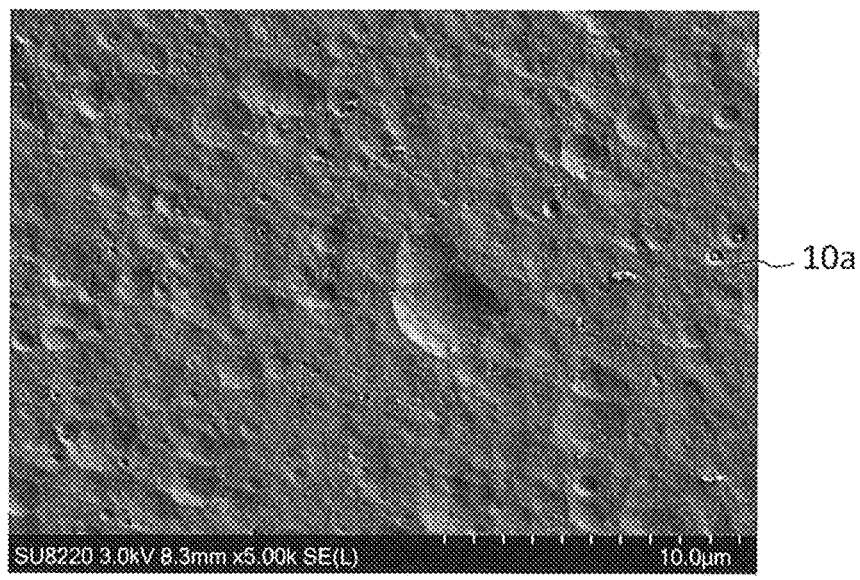
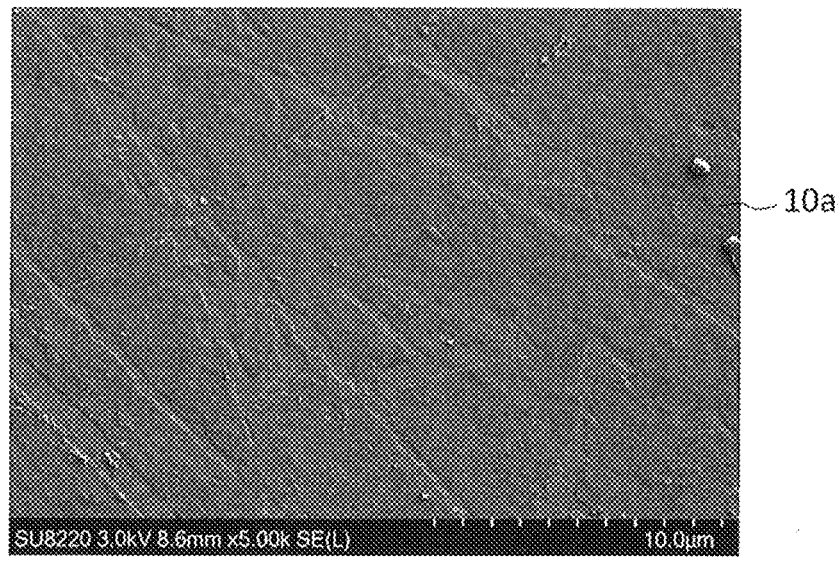
Fig. 14D

Fig. 14E
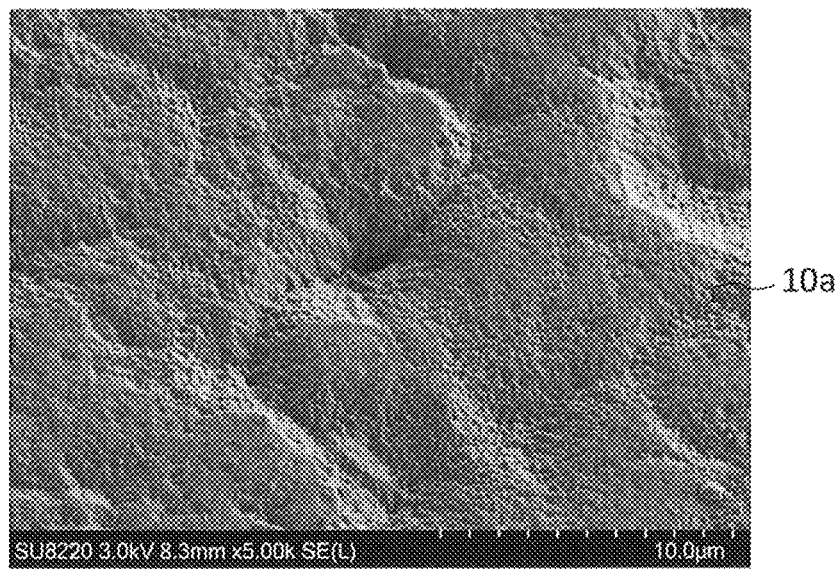
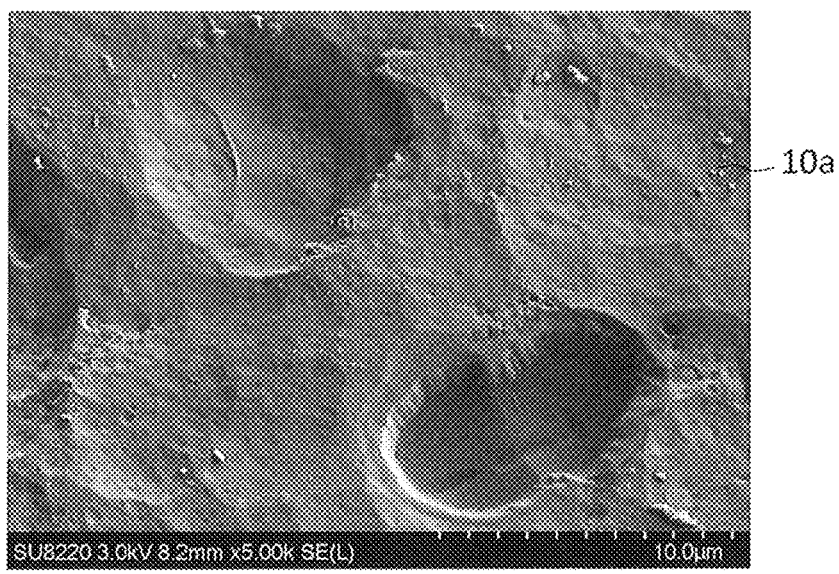
Fig. 14F

Fig. 14H
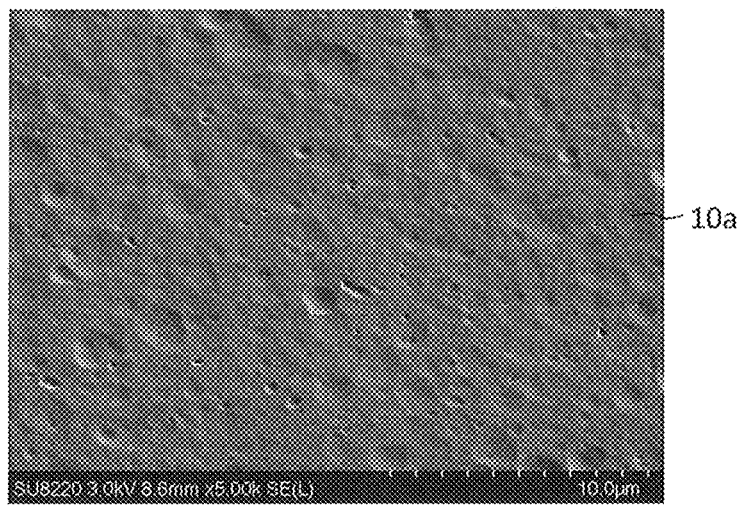
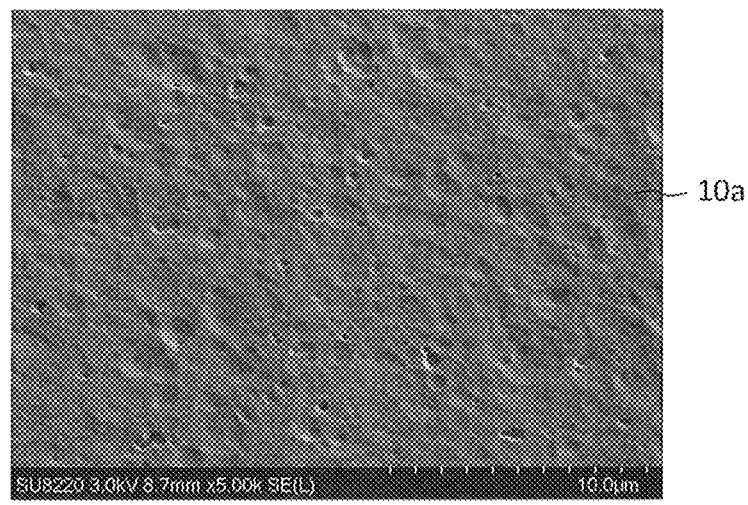
Fig. 14I

Fig. 14J
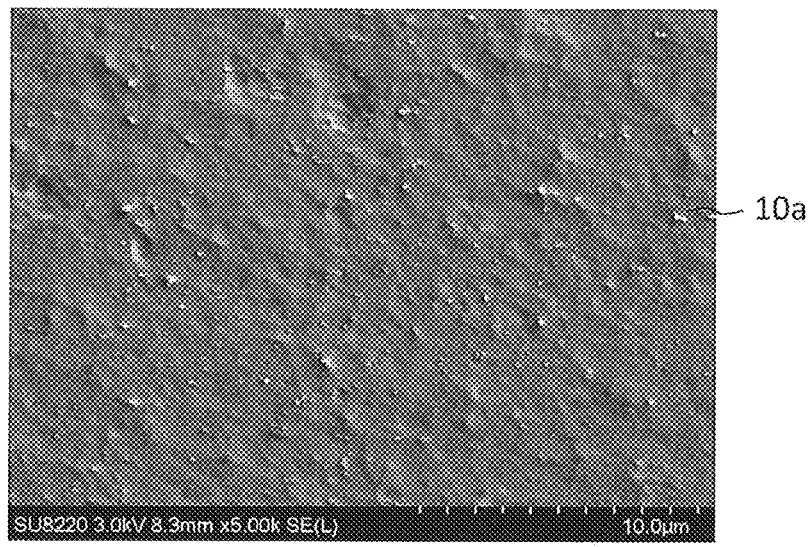
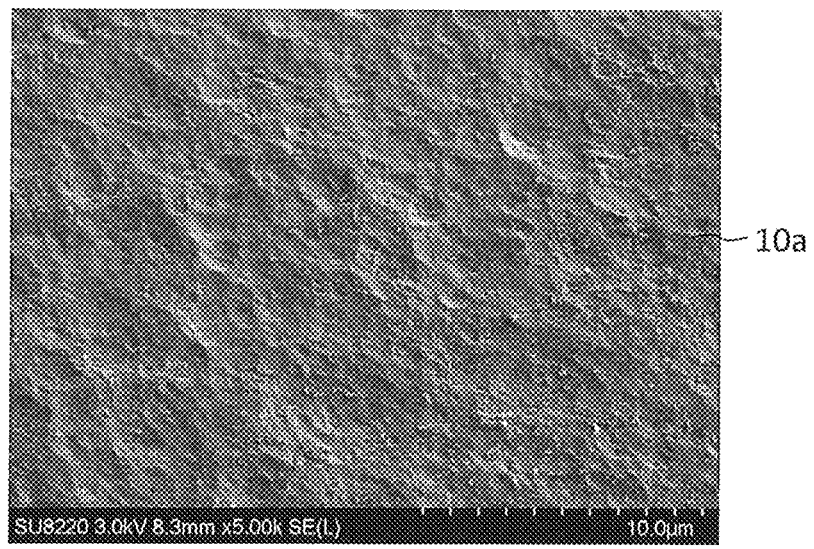
Fig. 14K

Fig. 14L
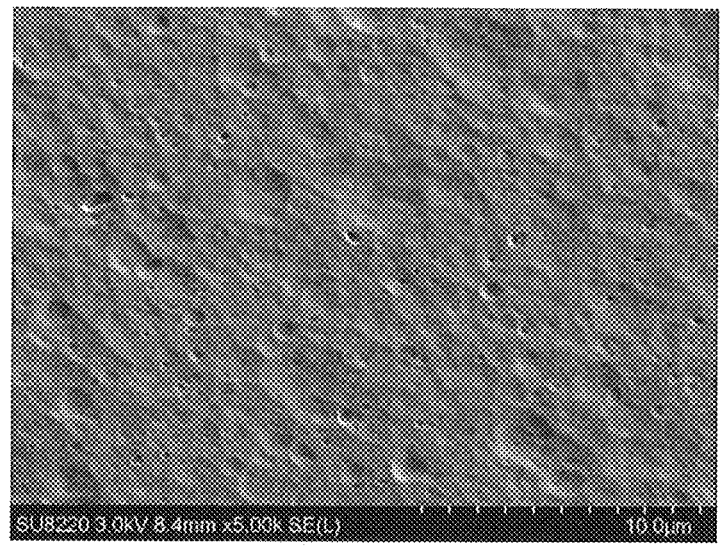
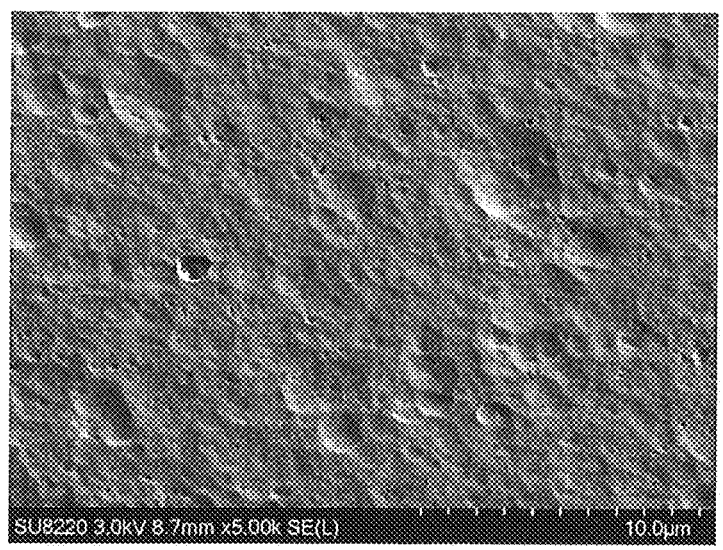
Fig. 14M

COMPOSITE STRUCTURE, SEMICONDUCTOR MANUFACTURING APPARATUS AND DISPLAY MANUFACTURING APPARATUS PROVIDED WITH COMPOSITE STRUCTURE

CROSS-REFERENCE TO RELATED APPLICATIONS

This application is based upon and claims the benefit of priority from Japanese Patent Application Nos. 2018-042030, filed on Mar. 8, 2018; 2018-042047, filed on Mar. 8, 2018; 2018-118281, filed on Jun. 21, 2018; 2018-129261, filed on Jul. 6, 2018; 2018-129262, filed on Jul. 6, 2018; and 2019-010708, filed on Jan. 25, 2019, the contents of which are incorporated herein by reference.

BACKGROUND OF THE INVENTION

Field of the Invention

The present invention relates to a composite structure having a substrate which is imparted with a function by coating a substrate surface with a polycrystalline ceramic. Further, the present invention relates to a semiconductor manufacturing apparatus and a display manufacturing apparatus which are provided with the composite structure. In particular, the present invention relates to a composite structure, which is superior in low-particle generation and used in an environment exposed to corrosive plasma, such as a member of a semiconductor manufacturing apparatus and to a semiconductor manufacturing apparatus and a display manufacturing apparatus which are provided with the composite structure.

Related Art

There has been known a technology with which a substrate is imparted with a function by means of coating a surface thereof with a ceramics. Illustrative examples of the ceramic coat include a plasma-resistant coat of a chamber-composing member in a semiconductor manufacturing apparatus, an insulation coat in a heat-dissipating substrate, an ultra-smooth coat in an optical mirror, and a scratch- and abrasion-resistant coat in a sliding member. As functionalization in these members as mentioned above progresses, a demand level thereof becomes increasingly high. In these ceramic coats, the performance thereof may be determined not only by a composition of the material but also by a physical structure, especially by a fine structure thereof.

As the method to obtain the ceramic coat, various ceramic coating technologies have been developed, which include an aerosol deposition method (AD method), a physical vapor deposition method (PVD method) in which a thickness thereof is increased with a plasma-assisted method (plasma-enhanced physical vapor deposition (PEPVD) method) or an ion-assisted method (ion-assisted deposition (IAD) method), and a suspension spraying method using a fine suspension solution of a raw material.

In the ceramic coats carefully produced with these methods, a fine structure thereof is also controlled to a certain degree. According to some previous reports, the porosity thereof confirmed with an image analysis by means of SEM (scanning electron microscope) or the like has been in the range of 0.01 to 0.1%.

For example, JP 2005-217351A (PTL 1) discloses, as a plasma-resistant member for the semiconductor manufacturing apparatus, a layered structure formed of a polycrystalline yttria having the pore occupancy rate of 0.05% or less by area. It is reported that this layered structure has a suitable plasma-resistance.

KR 20170077830A (PTL 2) discloses a transparent fluorine-based $YF_3$ thin film having high resistances to plasma and a corrosive gas. It is reported that because the $YF_3$ thin film is dense with the porosity of 0.01 to 0.1%, this has high resistances to plasma. In addition, it is reported that the withstand voltage thereof is 50 to 150 V/μm.

JP 2016-511796A (PTL 3) discloses a ceramic coat film such as $Y_2O_3$ which includes constituent particles having the particle diameter in the range of 200 to 900 nm and constituent particles having the particle diameter in the range of 900 nm to 10 μm. It is reported that this coat film is dense with the porosity of 0.01 to 0.1% and is resistant to plasma. In addition, the withstand voltage thereof is reported to be 80 to 120 V/μm.

Bulletin of the Chemical Society of Japan (pp 1106-1108, 1979 (8), "Refractive Index and Reflectance of Yttrium Oxide Sintered Body") discloses the refractive index and the reflectance as the optical characteristics of an yttrium oxide sintered body, which is a transparent plate-like sample (see FIG. 20).

In the field of a semiconductor manufacturing apparatus, refinement of the semiconductor device advances year by year; and when EUV (extreme ultraviolet lithography) will be put in a practical use, the size thereof is expected to reach several nanometers. According to MORE MOORE WHITE PAPER 2016 EDITION in IRDS (International Roadmap for Devices and Systems) prepared by IEEE (The Institute of Electrical and Electronics Engineers, Inc.), the half-pitch between the devices in a lateral direction was 18.0 nm in 2017; and it is expected to be reduced to 12.0 nm in 2019 and to 10.0 nm or less after 2021.

Further narrowing of the circuit line width and refinement of the circuit pitch are progressing with an aim to higher integration of the semiconductor. In addition, for example, in an etching process, corrosive plasma such as chlorine-based plasma, fluorine-based plasma such as $CF_4$ and $NF_3$, or the like is used. From now on, a treatment using high-density plasma than ever will be carried out; and thus, a further high level of a low-particle generation will be required in many members in the semiconductor manufacturing apparatus.

In the past, the particle generation problem has been solved by lowering the structure's porosity to in the range of, for example, 0.01 to 0.1% with an assumption that the plasma-resistance of a ceramic coat relates to the structure's porosity so that generation of the particles may be suppressed by suppressing the loss of the ceramic coat itself due to plasma corrosion. However, according to the information found by the inventors of the present invention, as the further refinement progresses, even in the structure having a very low porosity, the problem of suppression of the particle generation may not be solved any more. In other words, we reached the understanding that the particle generation needs to be controlled more precisely not only by paying attention only to the loss of the ceramic coat by means of a porosity index but also by other way from a different viewpoint.

Namely, in the recent trends to further refinement of the device and further densification of the plasma, the particle generation problem still exists even in the ceramic structure whose porosity is in the range of 0.01 to 0.1% in which it is considered there hardly exist pores; and thus, a structure having a further improved low-particle generation is wanted. In addition, in the fine device with the line width of a several nanometers of a future semiconductor circuit, too, a ceramic structure which can solve the particle generation problem is wanted.

Patent Literature

[PTL 1] JP 2005-217351A
[PTL 2] KR 20170077830A
[PTL 3] JP 2016-511796A

Non-Patent Literature

[NPL 1] Bulletin of the Chemical Society of Japan pp 1106-1108, 1979 (8)

SUMMARY OF THE INVENTION

The inventors of the present invention have now succeeded to obtain a composite structure capable of being reduced in the influence of the particle generation in the ceramic coat of a semiconductor apparatus or the like which is used, for example, under the situation that this is exposed to a corrosive plasma environment. In addition, it was found that several indexes have high correlation with the low-particle generation in a very high level; and on the basis of this finding, they succeeded to prepare the structure having an excellent low-particle generation that is defined by these indexes, specifically the indexes expressed in the first to fifth aspects to be described later.

Accordingly, the present invention provides a composite structure provided with a polycrystalline ceramic structure of which fine structure is controlled, in particular, to provide a composite structure provided on a substrate thereof with a polycrystalline ceramic structure which can solve the problem of suppressing generation of the particles even under the situations of further advanced refinement and plasma densification.

In addition, the present invention intends to provide a semiconductor manufacturing apparatus and a display manufacturing apparatus which are provided with this composite structure.

BRIEF DESCRIPTION OF THE DRAWINGS

FIGS. 3D-3E show luminance line profiles of luminance values measured along the thickness direction T of a sample.

FIGS. 5A-5B illustrate the TEM image G and the luminance value of each pixel.

FIGS. 6A-6B illustrate how to correct the luminance of the TEM image G.

FIGS. 7A-7D illustrate drawings of the luminance value in the luminance-obtaining region R.

FIGS. 12A-12E illustrates the scanning electron microscope (SEM) images of the structure 10.

FIGS. 14A-14M illustrate the scanning electron microscope (SEM) images of the surface of the structure 10 after the standard plasma-resistance test.

DESCRIPTION OF EMBODIMENTS

Composite Structure

Figure 1:
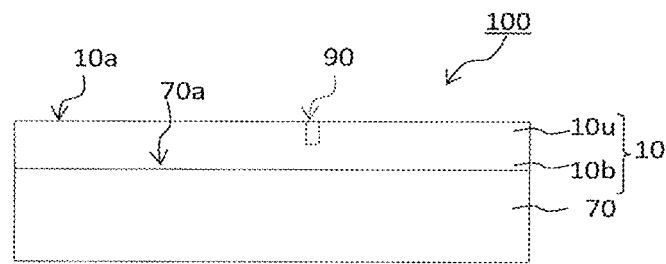
FIG. 1 is a schematic drawing of the cross section of the composite structure 100 according to the present invention.

The basic structure of the composite structure according to the present invention will be explained by using FIG. 1. FIG. 1 is a schematic drawing of the cross section of the composite structure 100 according to the present invention. The structure 10 is provided on the surface 70a of the substrate 70. The structure 10 has the surface 10a. The surface 10a is exposed to an environment in which physical properties and characteristics imparted to the composite structure from the structure 10 are required. Therefore, for example, in the case where the composite structure of the present invention is imparted with the physical property and characteristics from the structure 10, for example, with the low-particle generation, the surface 10a is exposed to a corrosive gas such as plasma. In the present invention, the structure 10 includes a polycrystalline ceramic. The structure 10 which is provided for the composite structure of the present invention has prescribed values of the indexes of the first to fifth aspects to be described later.

The structure 10 which is provided for the composite structure of the present invention is a so-called ceramic coat. By disposing a ceramic coat, various physical properties and characteristics can be imparted to the substrate 70. In this specification, the structure (or a ceramic structure) and the ceramic coat are used with the same meaning unless otherwise specified.

According to an aspect of the present invention, the structure 10 is mainly composed of a polycrystalline ceramics. The amount of the polycrystalline ceramics included therein is 70% or more, preferably 90% or more, while more preferably 95% or more. The most preferably, the structure 10 is composed of 100% of the polycrystalline ceramics.

According to an aspect of the present invention, the structure 10 may include both a polycrystalline region and an amorphous region, though it is more preferable that the structure 10 be composed of only the polycrystal.

Measurement Method of the Crystallite Size

Figure 11:
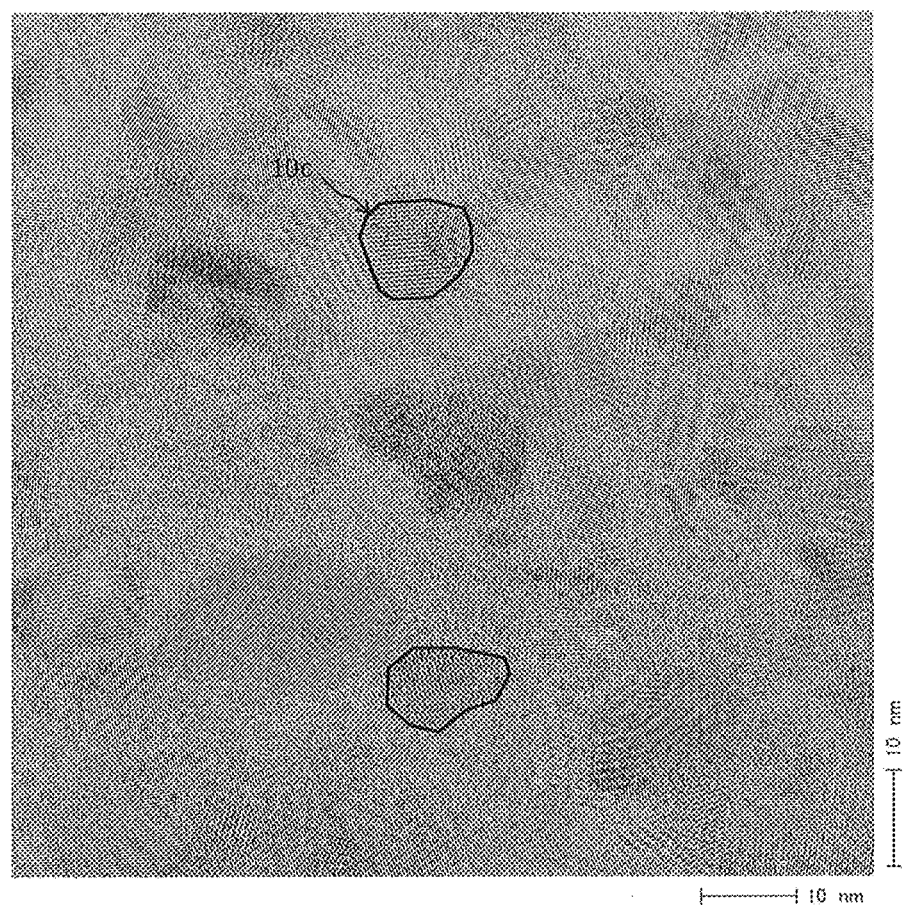
FIG. 11 is the TEM image of the structure 10 with a magnification of 400,000.
Figure 12E:
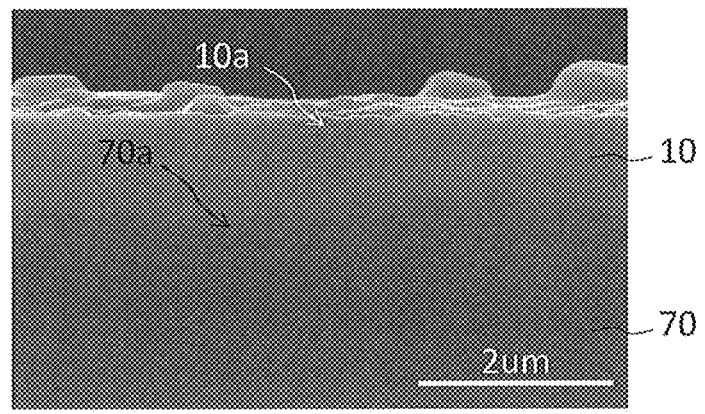

In the present invention, the size of the polycrystalline ceramic which constitutes the structure 10 is 3 nm or more and 50 nm or less as the average crystallite size measured with the condition described below. More preferably the upper limit thereof is 30 nm, more preferably 20 nm, while still more preferably 15 nm. The lower limit thereof is preferably 5 nm. In the present invention, this "average crystallite size" is the value obtained in such a way that images of 15 crystallites are taken by a transmission electron microscope (TEM) with the magnification of 400,000 or more, and then, from the diameters of the approximated circles thereof are averaged. Therein, the sample thickness in the FIB (focused ion beam) process is made sufficiently thin, such as, for example, about 30 nm so that the crystallite can be clearly distinguished. The magnification of the image can be arbitrarily selected in the range of 400,000 or more. FIG. 11 is an example of the TEM image to measure the crystallite size. Specifically, FIG. 11 is the TEM image of the structure 10 with the magnification of 2,000,000. In the drawings, the region enclosed with 10c is the crystallite.

The ceramics which constitutes the structure 10 may be arbitrarily determined in accordance with the desired physical properties and characteristics to be imparted to the substrate 70 as described above; and they may be a metal oxide, a metal fluoride, a metal nitride, a metal carbide, or a mixture of them. According to an aspect of the present invention, illustrative example of the compound having a good low-particle generation includes a rare earth element of an oxide, a fluoride, and an acid fluoride (LnOF), as well as a mixture of them, i.e., at least two of a rare earth element of an oxide, a rare earth element of a fluoride, and a rare earth element of an acid fluoride. More specifically, Y, Sc, Yb, Ce, Pr, Eu, La, Nd, Pm, Sm, Gd, Tb, Dy, Ho, Er, Tm, and Lu may be cited as the rare earth element Ln.

In the case where the structure 10 is for insulation, a material such as $Al_2O_3$, $ZrO_2$, AlN, SiC, $Si_3N_4$, cordierite, forsterite, mullite, or silica may be used.

In the present invention, thickness of the structure 10 may be arbitrarily determined by taking the required use, characteristic, film strength, and the like into consideration. The thickness is generally in the range of 0.1 to 50 μm, wherein the upper limit thereof is, for example, 20 μm; or it may be 10 μm, 5 μm, or even 1 μm or less. The thickness of the structure 10 may be confirmed, for example, in such a way that the structure 10 is cut followed by observation of the broken cross section thus formed with SEM.

In the present invention, the substrate 70 is the target to be imparted with functionality by the structure 10, wherein the substrate may be arbitrarily determined. Illustrative example of the material thereof includes a ceramics, a metal, and a resin; or a composite of them may be used as well. Illustrative example of the composite includes a composite substrate of a resin with a ceramics and a composite substrate of a fiber-reinforced plastic with a ceramics. The shape thereof is not particularly restricted, and thus, they may be a flat plane, a concave plane, a convex plane, or the like.

According to an aspect of the present invention, the surface 70a of the substrate 70 to which the structure 10 is bonded is preferably flat so as to make the structure 10 suitable. According to an aspect of the present invention, irregularity of the surface 70a is removed by carrying out at least any of blasting, physical polishing, chemical mechanical polishing, rubbing, and chemical polishing onto the surface 70a of the substrate 70. Removal of the irregularity like this is carried out such that, for example, the two-dimensional arithmetical mean roughness Ra of the surface 70a after the removal may become 0.2 μm or less, while preferably 0.1 μm or less, or that the two-dimensional arithmetical mean height Rz thereof may become preferably 3 μm or less.

The composite structure according to the present invention can be suitably used in various members in the semiconductor manufacturing apparatus, especially as the member that is used in the environment exposed to a corrosive plasma atmosphere. The member used in the semiconductor manufacturing apparatus is required to have the low-particle generation as described before. This is because the structure including a polycrystalline ceramic, the structure being provided for the composite structure according to the present invention, has an excellent low-particle generation.

In the case when the composite structure according to the present invention is used as the member which is used in an environment exposed to a corrosive plasma atmosphere, illustrative example of the ceramic composition which constitutes the structure 10 includes $Y_2O_3$, yttrium oxyfluorides (YOF, $Y_5O_4F_7$, $Y_6O_5F_8$, $Y_7O_6F_9$, and $Y_{17}O_{14}F_{23}$), $(YO_{0.826}F_{0.17})F_{1.174}$, $YF_3$, $Er_2O_3$, $Gd_2O_3$, $Nd_2O_3$, $Y_3Al_5O_{12}$, $Y_4Al_2O_9$, $Er_3Al_5O_{12}$, $Gd_3Al_5O_{12}$, $Er_4Al_2O_9$, $ErAlO_3$, $Gd_4Al_2O_9$, $GdAlO_3$, $Nd_3Al_5O_{12}$, $Nd_4Al_2O_9$, and $NdAlO_3$.

Plasma-Resistance

The composite structure according to the present invention which is specified by the indexes of the first to fifth aspects to be described later is imparted with a plasma-resistance. The plasma-resistance thereof may be assessed by the plasma-resistance test to be described below as one standard method. Hereinafter, in this specification, this plasma-resistance test is called "standard plasma-resistance test".

As an aspect of the present invention, in the composite structure, the arithmetical mean height Sa of the surface 10a of the structure 10 after the "standard plasma-resistance test" is preferably 0.060 or less, while more preferably 0.030 or less. The arithmetical mean height Sa will be explained later.

In the "standard plasma-resistance test", an inductively coupled plasma reactive ion etching apparatus (Muc-21 Rv-Aps-Se; Manufactured by Sumitomo Precision Products Co., Ltd.) is used as the plasma etching apparatus. The plasma etching conditions with the ICP (inductively coupled plasma) output of 1500 W as the power output, the bias output of 750 W, a mixed gas of $CHF_3$ gas with 100 ccm and $O_2$ gas with 10 ccm as the process gas, the pressure of 0.5 Pa, and the plasma etching time of 1 hour are used.

The condition of the surface 10a of the structure 10 after plasma irradiation is photographed by a laser microscope (for example, OLS4500 manufactured by Olympus Corp.). Details of the observation condition and so forth will be described later.

From the obtained SEM image, the arithmetical mean height Sa of the surface after plasma irradiation is calculated. Here, the arithmetical mean height Sa is a three-dimensional roughness parameter (three-dimensional height-direction parameter), which is a three-dimensionally extended version of the two-dimensional arithmetical mean roughness Ra. Specifically, the arithmetical mean height Sa is obtained by dividing the volume enclosed with a surface-forming curved plane and an average plane by a measured area. In other words, the arithmetical mean height Sa is defined by the following equation, provided that the average plane is represented by a xy plane, the vertical direction is represented by a z-axis, and the measured surface-forming curved plane is represented by z (x, y). Here, "A" in the following equation is the measured area.

$$Sa = \frac{1}{A} \int \int_A |z(x, y)| dx dy$$

The arithmetical mean height Sa is basically independent of the measurement method thereof. In the "standard plasma-resistance test" in this specification, the calculation thereof is carried out with the following conditions. For calculation of the arithmetical mean height Sa, a laser microscope is used. Specifically, the laser microscope OLS 4500 (manufactured by Olympus Corp.) is used. An objective lens of MPLAPON 100×LEXT (numerical aperture of 0.95, operating distance of 0.35 mm, focused spot diameter of 0.52 μm, and measurement area of 128×128 μm) with a magnification of 100 is used. The λc filter for removal of an undulation portion is set to 25 μm. The measurement is carried out at three arbitrary spots, and the average value thereof is taken as the arithmetical mean height Sa. For other conditions, the international standard ISO 25178 for the three-dimensional surface shape is referred as appropriate.

First Aspect of the Present Invention

With regard to the information as the basis of a first aspect of the present invention, the inventors of the present invention succeeded to significantly reduce the influence of the particle generation in a composite structure which is provided with a structure including a polycrystalline ceramic and is used under the situation that the semiconductor manufacturing apparatus is exposed, for example, to a corrosive plasma environment. In addition, it was found that the low-particle generation could be assessed in a very high accuracy level by using, as an index, a hydrogen amount included in the structure measured with a dynamic-secondary ion mass spectrometry (D-SIMS method).

According to a first aspect of the present invention, there is provided a composite structure comprising a substrate and a structure which is provided on the substrate and has a surface; wherein the structure comprises a polycrystalline ceramic; and a hydrogen atom number per unit volume of the structure in a measurement depth at any one of 500 nm and 2 μm which are measured with a dynamic-secondary ion mass spectrometry (D-SIMS method) is $7 \times 10^{21}$ atoms/cm$^3$ or less.

Figure 18A:
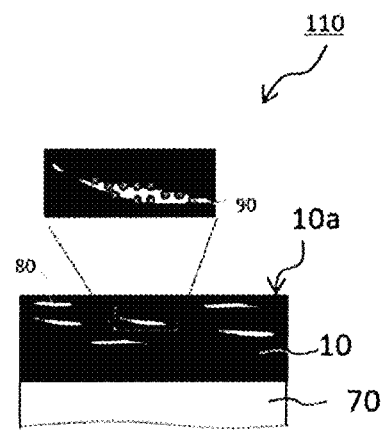
FIGS. 18A-18B illustrate the schematic cross section drawings to explain about the fine structure of the composite structure.
Figure 18B:
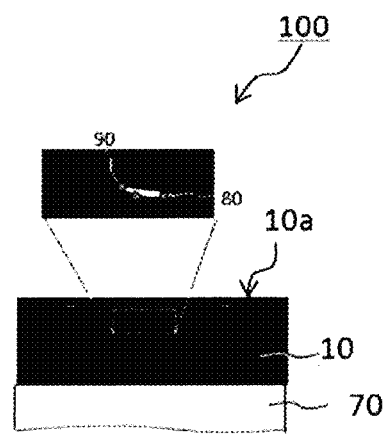

FIGS. 18A, 18B illustrates the schematic cross section drawings to explain about the fine structure of the composite structure. FIG. 18A is the conventional composite structure 110, and FIG. 18B is the composite structure 100 according to the present invention. In the drawings, the number 80 represents a rough structure in a level of nanometers and the number 90 represents a water molecule (OH group). In order to help understanding, in FIGS. 18A, 18B the size of the rough structure 80 in a level of nanometers is enlarged, but actually in both the composite structures 100 and 110, the porosity according to a conventional assessment method such as SEM is in the range of 0.01 to 0.1%.

The inventors of the present invention noted that the particle generation problem can remain unsolved even if the porosity of the structure is as low as in the range of 0.01 to 0.1%; and then, they succeeded to obtain a novel structure with which the particle generation problem can be solved in a higher level. As the reason for having the particle generation problem unsolved, the inventors of the present invention presumed that there is a fluctuation in the density of the fine structure of the structure in a level of nanometers so that the plasma-resistance in the rough structure 80 is lower than the dense structure. It was also presumed that, for example, the water molecule (OH group) included in an air is present in a very small space in a level of nanometers in the rough structure 80, so that a relationship with the low-particle generation might be obtained by quantifying this amount. And then, they found that by quantifying a hydrogen amount of the water molecule (OH group), the composition of the novel structure with which the particle generation problem can be solved in a higher level could be identified.

Specifically, in FIGS. 18A, 18B, it is presumed that the rough structure 80 in the composite structure 100 of the present invention is less than that in the conventional composite structure 110, so that presumably the water molecule (OH group) amount in the rough structure 80 thereof is less either. By quantifying the hydrogen amount (hydrogen atom number per unit volume) in the structure 10 with the dynamic-secondary ion mass spectrometry (D-SIMS method) to be mentioned later, this can be correlated with the low-particle generation.

Preparation of the Sample to Measure the Hydrogen Amount in the First Aspect of the Present Invention In the first aspect of the present invention, the sample to measure the hydrogen amount can be prepared, for example, by the method described below.

Figure 8:
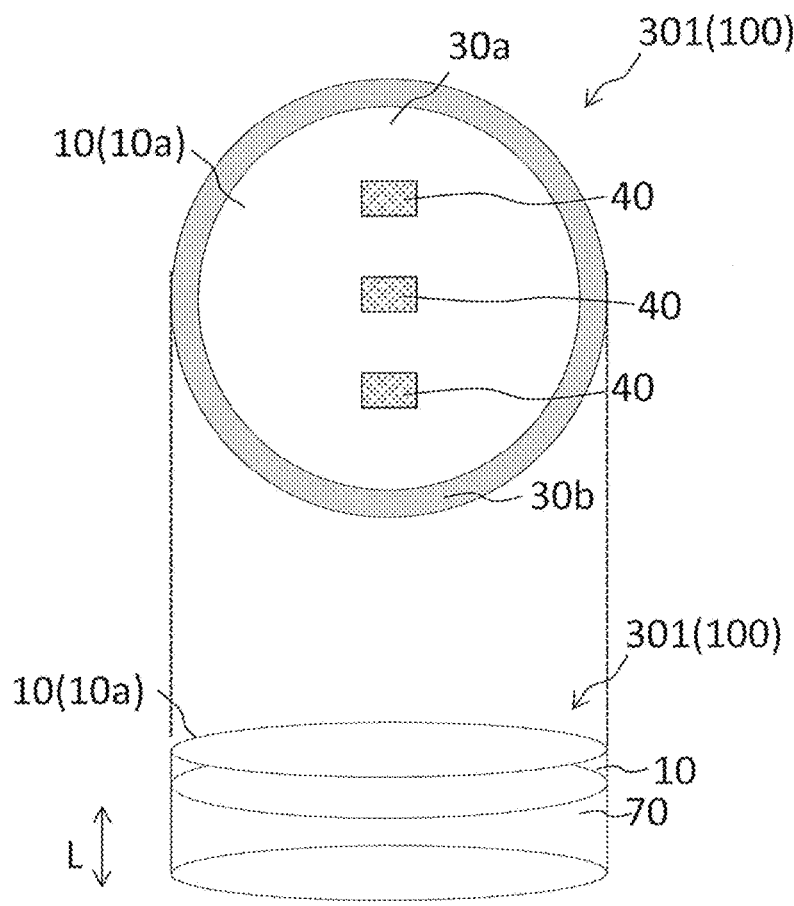
FIG. 8 is a schematic view illustrating the example in which the composite structure 100 is used as the semiconductor manufacturing apparatus component 301.
Figure 9:
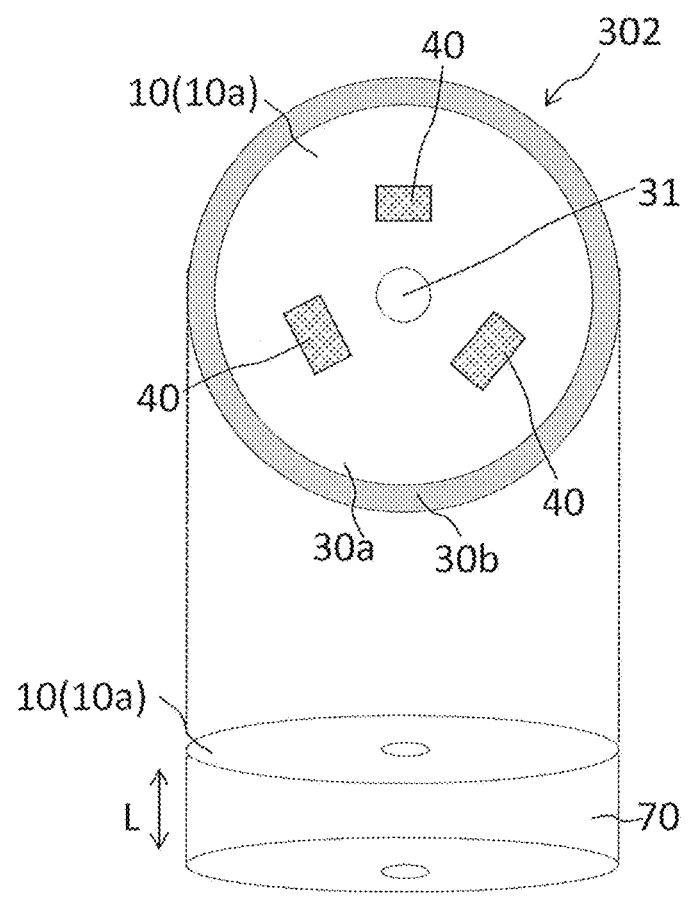
FIG. 9 is a schematic view illustrating the example in which the composite structure 100 is used as the semiconductor manufacturing apparatus member 302.

First, in advance, the composite structure provided with the structure 10 is cut out by means of a dicing machine or the like. At this time, the portions corresponding to the sample-obtaining portions 40 of FIG. 8 and FIG. 9 are cut out. Though the size thereof may be arbitrarily, it is, for example, in the range of 3 mm×3 mm to 7 mm×7 mm with the thickness of about 3 mm. Here, the thickness of the sample may be appropriately determined in accordance with the measurement instrument and the like, wherein the thickness is adjusted by shaving or the like of the surface in the side not formed with the structure 10 in the substrate 70. By polishing or the like, the arithmetical mean roughness Ra, which is the parameter of the two-dimensional surface roughness, of the surface 10a of the structure 10 is made to 0.1 μm or less, while more preferably 0.01 μm. The thickness of the structure 10 is made to at least 500 nm or more, preferably 1 μm or more, while more preferably 3 μm or more.

In the D-SIMS method to measure the hydrogen amount in the present invention, in general, a standard sample is used. As the standard sample, it is preferable to use the same composition and the same structure as those of the target sample for the measurement. For example, at least two samples are prepared, wherein one of them may be used as the standard sample. Details of the standard sample will be described later.

The state of the sample before measurement of the hydrogen amount will be explained.

As described above, in the present invention, the hydrogen amount is used to specify the rough structure of the structure 100 in a level of nanometers. Therefore, among other things, it is important to control the sample so as to be allowed to leave in a constant temperature and humidity chamber for a prescribed period of time before measurement of the hydrogen amount. Specifically, in the present invention, the hydrogen amount should be measured after the sample is allowed to leave for 24 hours or more in the state of the room temperature of 20 to 25° C., the humidity of 60±10%, and the atmospheric pressure.

Measurement of the Hydrogen Amount in the First Aspect of the Present Invention

The measurement method of the hydrogen amount in the first aspect of the present invention will be explained below.

In the present invention, the hydrogen amount is measured with a secondary ion mass spectrometry, i.e., a dynamic-secondary ion mass spectrometry (D-SIMS method). For this measurement, for example, IMF-7f (manufactured by CAMECA SAS) is used as the instrument.

The measurement condition will be then described.

First, conductive platinum (Pt) is vapor-deposited onto the structure surface. As the measurement condition, a cesium (Cs) ion is used as a primary ion species. The primary acceleration voltage is made to 15.0 kV, and the detection area is made to 8 μmg. The measurement depths are made to 500 nm and 2 μm.

The low-particle generation is largely dependent on the condition of the structure surface which is exposed directly to a plasma atmosphere. Therefore, by quantifying the hydrogen amount in the region whose depth is at least about 500 nm from the structure surface, the hydrogen amount and the low-particle generation can be effectively linked with each other. On the other hand, when the thickness of the structure is sufficiently thick and the fine structure from the surface till the target measurement depth is almost homogeneous, reliability of the quantification result can be enhanced by extending the measurement range to about 2 μm. Here, the structure 10 has the lower region 10$b$ in the side to the substrate 70 and the upper region 10$u$ in the side to the surface 10$a$ (see FIG. 1), wherein in the case when a laminate structure is formed such that the low-particle generation in the upper region 10$u$ is higher than the lower region 10$b$, it is preferable to set the measurement depth so as to be able to measure the hydrogen amount only in the upper region 10$u$. From this viewpoint, it is satisfactory when the hydrogen amount satisfies the amount defined by the present invention in any of the measurement depth of 500 nm and 2 μm. It is preferable that the hydrogen amount satisfy the amount defined by the present invention in both the measurement depths of 500 nm and 2 μm.

For measurement of the hydrogen amount, a measurement sample and a standard sample need to be prepared.

With an aim to remove the factors relating to the measurement condition, the standard sample is generally used in the SIMS method in order to standardize the signal strength of the ion species to be analyzed by the signal strengths of the ion species including matrix elements of the sample. More specifically, the assessment sample, the standard sample which is for the assessment sample and has the same matrix components as the assessment sample, a Si single crystal, and the standard sample for the Si single crystal are used. The standard sample for the assessment sample is obtained by introducing heavy hydrogen into the sample having the same matrix components as the assessment sample. At the same time with this, the heavy hydrogen is also introduced into the Si single crystal, so that it is presumed that the same amount of the heavy hydrogen is introduced into the standard sample for the assessment sample and into the Si single crystal. Thereafter, the heavy hydrogen amount introduced into the Si single crystal is identified by using the standard sample for the Si single crystal. With regard to the standard sample for the assessment sample, the secondary ion strengths of the heavy hydrogen and of the composition elements are calculated by using the dynamic-secondary ion mass spectrometry method (D-SIMS method) thereby calculating a relative sensitivity factor. By using the relative factor calculated from the standard sample for the assessment sample, the hydrogen amount of the assessment sample is calculated. With regard to other things, the reference can be made to ISO 18114 "Determining relative sensitivity factors from ion-implanted reference materials" (International Organization for Standardization, Geneva, 2003)).

In the present invention, the hydrogen atom number per unit volume included in the structure which constitutes the composite structure is $7 \times 10^{21}$ atoms/cm$^3$ or less at least in any one of the measurement depths of 500 nm and 2 μm, the measurement being done with the dynamic-secondary ion mass spectrometry (D-SIMS).

In the structure of the present invention, the surface thereof is exposed directly to, for example, a plasma atmosphere. Therefore, especially the condition of the structure surface is important. The inventors of the present invention studied with the presumption that even in the structure whose porosity is 0.01 to 0.1% thereby hardly including the pore, the generation problem may be still unsolved because of the influence of the fine structure in a level of nanometers; and as a result, it was succeeded to control the fine structure in a level of nanometers, and in addition, a novel structure with which the particle generation problem can be solved in a higher level could be obtained. In addition, it was newly found that the composition of this novel structure can be specified by the hydrogen amount (hydrogen atom numbers per unit volume) in the surface thereof as the index. Further, a relationship was found between the hydrogen amount in the structure surface and the low-particle generation. With these findings, the present invention could be conceived.

Specifically, for example, in an air, it is considered that the hydrogen atom is present, for example, as the state of a hydroxyl group (—OH). The size of the water molecule is 3 Å, and that of the hydroxyl group is about 1 Å; and it is presumed that only a minute amount thereof is present in the rough structure 80 of the structure. By using this hydrogen amount as the index, the fine structure in a level of nanometers can be expressed.

In the present invention, as the hydrogen amount of the structure, the hydrogen atom number per unit volume measured with D-SIMS is $7 \times 10^{21}$ atoms/cm$^3$ or less in any of the measurement depths of 500 nm and 2 μm. The hydrogen atom number per unit volume is preferably $5 \times 10^{21}$ atoms/cm$^3$ or less.

Here, it is presumed that the smaller the hydrogen amount in the structure of the composite structure is, the better the structure is; however, it is clear among those skilled in the art that there is actually a measurement limit. Therefore, the measurement limit is considered to be a lower limit of the hydrogen amount in this aspect. The same is true in a second aspect described later.

Second Aspect of the Present Invention

In a second aspect of the present invention, similarly to the first aspect of the present invention, the hydrogen amount is used as the index, wherein the hydrogen amount as the index is measured with a hydrogen forward scattering spectrometry (HFS)-Rutherford backscattering spectrometry (RBS) (RBS-HFS method) and a proton-hydrogen forward scattering spectrometry (p-RBS) method. The inventors of the present invention succeeded to significantly reduce the influence of the particle generation in the composite structure which is provided with the structure including Y (yttrium) and O (oxygen) and is used under the situation that the semiconductor manufacturing apparatus or the like is exposed, for example, to a corrosive plasma atmosphere. In addition, it was found that the low-particle generation could be assessed in a very high accuracy level by using, as the index, the hydrogen amount included in the structure measured with the hydrogen forward scattering spectrometry (HFS)-Rutherford backscattering spectrometry (RBS) (RBS-HFS method) and the proton-hydrogen forward scattering spectrometry (p-RBS) method.

According to the second aspect of the present invention, there is provided a composite structure comprising a substrate and a structure which is provided on the substrate and has a surface; wherein the structure comprises a polycrystalline ceramic; and a hydrogen atom concentration of the structure, which is measured with a hydrogen forward scattering spectrometry (HFS)-Rutherford backscattering spectrometry (RBS) and a proton-hydrogen forward scattering spectrometry (p-RBS) method is 7 atom % or less.

The second aspect of the present invention is different from the first aspect of the present invention in the measurement method of the hydrogen amount, so that the explanation of the first aspect in this specification is also the explanation of the second invention except for the case that alteration is made because of the alteration in the measurement method.

Preparation of the Sample to Measure the Hydrogen Amount in the Second Aspect of the Present Invention In the second aspect of the present invention, the sample to measure the hydrogen amount can be prepared, for example, by the method described below.

First, in advance, the composite structure provided with the structure 10 is cut out by means of a dicing machine or the like. At this time, the portions corresponding to the sample-obtaining portions 40 of FIG. 8 and FIG. 9 are cut out. Though the size thereof may be arbitrarily, it is, for example, 20 mm×20 mm with the thickness of about 5 mm. Here, the thickness of the sample may be appropriately determined in accordance with the measurement instrument and the like, wherein the thickness is adjusted by shaving or the like of the surface in the side not formed with the structure 10 in the substrate 70. By polishing or the like, the arithmetical mean roughness Ra, which is the parameter of the two-dimensional surface roughness, of the surface 10a of the structure 10 is made to 0.1 μm or less, while more preferably 0.01 μm. The thickness of the structure 10 is made to at least 500 nm or more, preferably 1 μm or more, while more preferably 3 μm or more.

The state of the sample before measurement of the hydrogen amount will be explained.

As described above, in the present invention, the hydrogen amount is used to specify the rough structure of the structure 100 in a level of nanometers. Therefore, among other things, it is important to control the sample so as to be allowed to leave in a constant temperature and humidity chamber for a prescribed period of time before measurement of the hydrogen amount. Specifically, in the present invention, the hydrogen amount needs to be measured after the sample is allowed to leave for 24 hours or more in the state of the room temperature of 20 to 25° C., the humidity of 60%±10%, and the atmospheric pressure.

Measurement of the Hydrogen Amount in the Second Aspect of the Present Invention The measurement method of the hydrogen amount will be explained below.

In the present invention, the hydrogen amount is measured with a combination of the hydrogen forward scattering spectrometry (HFS)/Rutherford backscattering spectrometry (RBS) method (hereinafter, this is called the RBS-HFS method) with the RBS method using a proton (hereinafter, this is called the p-RBS method). For this measurement, for example, Pelletron 3SDH (manufactured by National Electrostatics Corp.) may be used as the instrument.

Quantification method of the hydrogen amount will be further explained.

The RBS-HFS method using a helium element (He) is carried out. Helium (He atom) is irradiated to the structure; and the back-scattered He atom and the front-scattered H atom are detected. With regard to the energy spectrum of the back-scattered He atom, elements are fitted in the order from the element showing the largest energy spectrum to calculate the scattering strengths thereof. The energy spectrum of the front-scattered H atom is also fitted to calculate the scattering strength thereof. On the basis of the scattering strengths thereby calculated, the ratios of the average atom numbers of the elements in the structure can be calculated. For example, in the case that the structure is made of yttrium oxide, the Y element, which shows the largest detected energy spectrum of the He atom, is fitted to calculate the scattering strength thereof. Next, the O element is fitted to calculate the scattering strength thereof. Here, it is preferable that identification of the element showing the largest energy spectrum be done by means of a combination with other method such as an energy dispersive X-ray analysis (EDX).

The ratio of the average atom numbers of the elements in the structure is measured with the RBS-HFS method, wherein in the present invention, in order to increase the measurement precision, the ratio of the average atom numbers of the elements other than the hydrogen atom in the structure is measured again with the p-RBS method using a proton element ($H^+$). In calculation, similarly to the RBS-HFS method, the elements are fitted in the order from the element showing the largest energy spectrum to calculate the scattering strengths thereof. On the basis of the scattered strengths thereby calculated, the ratio of the average atom numbers of the elements in the structure is calculated. Then, the hydrogen amount is calculated as the hydrogen atom concentration (atom %) from a combination of the ratio of the average atom numbers measured with the p-RBS method and the ratio of the average atom numbers of the hydrogen atom and the element showing the largest detected energy spectrum of the He atom measured with the RBS-HFS method (for example, in the case that the structure is yttrium oxide, the element showing the largest detected energy spectrum of the He atom is Y).

In the present invention, the order of the p-PBS method and the RBS-HFS method is not particularly restricted.

The measurement conditions will be then described.

RBS-HFS Method $^4He^+$ ions are used as the incident ions with the incident energy of 2300 keV, the incident angle of 75°, the scattering angle of 160°, the recoil angle of 30°, the sample current of 2 nA, the beam diameter of 1.5 mmφ, the irradiation amount of 8 μC, and without an in-plane rotation.

p-RBS Method

A hydrogen ion ($H^+$) is used as the incident ion with the incident energy of 1740 keV, the incident angle of 0°, the scattering angle of 160°, and without the recoil angle; and with the sample current of 1 nA, the beam diameter of 3 mmφ, the irradiation amount of 19 μC, and without an in-plane rotation.

In addition to the RBS-HFS method, by means of a combination thereof with the p-RBS method, the measurement precision of the hydrogen atom concentration can be increased furthermore so that the hydrogen amount (hydrogen atom concentration) can be quantified in correlation with the particle generation.

The hydrogen atom concentration included in the structure which constitutes the composite structure of the present invention is 7 atom % or less. In the structure of the present invention, the surface thereof is exposed directly to, for example, a plasma atmosphere. Therefore, especially the condition of the structure surface is important. The inventors of the present invention studied with the presumption that even in the structure whose porosity is 0.01 to 0.1% thereby hardly including the pore, the particle generation problem may be still unsolved because of the influence of the fine structure in a level of nanometers; and as a result, it was succeeded to control the fine structure in a level of nanometers, and in addition, a novel structure with which the particle generation problem can be solved in a higher level could be obtained. In addition, it was newly found that the composition of this novel structure can be specified by the hydrogen amount (hydrogen atom concentration) in the surface thereof as the index. Further, it was found that there is a relationship between the hydrogen amount in the structure surface and the low-particle generation; and therefore, with this finding, the present invention was conceived.

Specifically, for example, in an air, it is considered that the hydrogen atom is present, for example, as the state of a hydroxyl group (—OH). The size of the water molecule is 3 Å, and that of the hydroxyl group is about 1 Å; and thus, it is presumed that only minute amounts thereof are present in the rough structure 80 of the structure. By using this hydrogen amount (hydrogen atom concentration) as the index, the fine structure in a level of nanometers can be expressed.

In the present invention, the hydrogen amount is determined with a combined method of the p-RBS method and the RBS-HFS method. In the combined method, the helium ion or the hydrogen ion is made incident to the sample surface thereby scattering the hydrogen toward a front direction and the helium toward a backward direction by an elastic scattering, and whereby the hydrogen amount is quantified by detecting this hydrogen. At this time, the measurement depth of the hydrogen amount is in the range of 400 to 500 nm from the surface 10a. Therefore, the fine structure of the surface 10a which can have the highest influence to the low-particle generation in the structure 10 can be appropriately quantified.

Third Aspect of the Present Invention

As the basic information for a third aspect of the present invention, it was found that the luminance Sa, the new index, has a high correlation with the low-particle generation in a very high level. On top of it, the structure having an excellent low-particle generation that is defined with the luminance Sa of less than a prescribed value could be obtained. In other words, not only the structure having an excellent low-particle generation could be successfully obtained but also it was found that the low-particle generation thereof could be quantified by means of the luminance Sa. In addition, the assessment method to obtain the luminance Sa was established.

The inventors of the present invention further found that the luminance Sa that is correlated with the low-particle generation is the index with which a further fine structure (fine structure) can be assessed in a ceramic structure, especially in a structure such as those assessed to have the porosity of 0.01 to 0.1%.

According to a third aspect of the present invention, there is provided a composite structure comprising a substrate and a structure which is provided on the substrate and has a surface; wherein the structure comprises a polycrystalline ceramic; and
a luminance Sa calculated by a following method is 19 or less, where
the method to obtain the luminance Sa comprises the steps of:
(i) preparing a transmission electron microscope (TEM) observation sample of the structure,
(ii) preparing a digital white and black image of a bright-field image of the TEM observation sample,
(iii) obtaining a luminance value which is expressed by 256 gradations in color data of each pixel in the digital white and black image,
(iv) correcting the luminance value, and
(v) calculating the luminance Sa by using the luminance value after the correction;
and
in the step (i),
as the TEM observation sample, at least three samples are prepared from the structure,
the at least three TEM observation samples each are prepared by using a focused ion beam method (FIB method) with suppressing a processing damage,
during the FIB processing, a carbon layer and a tungsten layer are formed on surface of the structure for prevention of static charge and for sample protection, and
when a direction of the FIB processing is taken as a vertical direction, an upper part thickness of the sample, which is a length of a short axis direction of the structure surface in a plane perpendicular to the vertical direction is 100±30 nm; and
in the step (ii),
the digital white and black image is obtained in each of the at least three TEM observation samples,
each of the digital white and black images is obtained by using a transmission electron microscope (TEM) with a magnification of 100,000 and an acceleration voltage of 200 kV, and the image includes the regions of the structure, the carbon layer, and the tungsten layer,
in each of the digital white and black images, a region for obtaining a luminance (a luminance-obtaining region), which has a region's vertical length of 0.5 μm in the vertical direction from the surface of the structure is set, and
a plurality of the digital white and black images are obtained from each of the at least three TEM observation samples such that a total area of the luminance-obtaining regions may be 6.9 μm$^2$ or more; and
in the step (iv),
the luminance values are relatively corrected by using 256 gradations where as a 255 gradation a luminance value of the carbon layer is set and as a 0 gradation a luminance value of the tungsten layer is set in order to give a luminance value after correction; and
in the step (v),
for each of the luminance-obtaining regions, an average of absolute values of differences of the luminance values after the correction in each pixel is calculated by using a least-square method, and an average thereof is taken as the luminance Sa.

According to a third aspect of the present invention, there is also provided a method for assessing a fine structure of a structure which comprises a polycrystalline ceramic and has a surface, wherein the method comprises the steps of:
(i) preparing a transmission electron microscope (TEM) observation sample of the structure,
(ii) preparing a digital white and black image of a bright-field image of the TEM observation sample, (iii) obtaining a luminance value which is expressed by 256 gradations in color data of each pixel in the digital white and black image, (iv) correcting the luminance value, and (v) calculating the luminance Sa by using the luminance value after the correction; and in the step (i), as the TEM observation sample, at least three samples are prepared from the structure, the at least three TEM observation samples each are prepared by using a focused ion beam method (FIB method) with suppressing a processing damage, during the FIB processing, a carbon layer and a tungsten layer are formed on surface of the structure for prevention of static charge and for sample protection, and when a direction of the FIB processing is taken as a vertical direction, an upper part thickness of the sample, which is a length of a short axis direction of the structure surface in a plane perpendicular to the vertical direction is 100±30 nm; and in the step (ii), the digital white and black image is obtained in each of the at least three TEM observation samples, each of the digital white and black images is obtained by using a transmission electron microscope (TEM) with a magnification of 100,000 and an acceleration voltage of 200 kV, and the image includes the regions of the structure, the carbon layer, and the tungsten layer, in each of the digital white and black images, a region for obtaining a luminance (a luminance-obtaining region), which has a region's vertical length of 0.5 µm in the vertical direction from the surface of the structure is set, and a plurality of the digital white and black images are obtained from each of the at least three TEM observation samples such that a total area of the luminance-obtaining regions may be 6.9 µm² or more; and in the step (iv), the luminance values are relatively corrected by using 256 gradations where as a 255 gradation a luminance value of the carbon layer is set and as a 0 gradation a luminance value of the tungsten layer is set in order to give a luminance value after correction; and in the step (v), for each of the luminance-obtaining regions, an average of absolute values of differences of the luminance values after the correction in each pixel is calculated by using a least-square method, and an average thereof is taken as the luminance Sa.

Luminance Sa in the Third Aspect of the Present Invention

In the third aspect of the present invention, the fine structure of the structure is expressed with an index called "luminance Sa". As will be explained in detail below, this "luminance Sa" is the index which is obtained by quantifying the pixel information of the digital white and black image of the bright-field image of the structure obtained with a transmission electron microscope (TEM). The structure of the composite structure according to the present invention is characterized by that the luminance Sa thereof is 19 or less, while preferably 13 or less.

It has already been described that the inventors of the present invention further found that the luminance Sa that is correlated with the low-particle generation is the index with which the further fine structure can be assessed in a ceramic structure, especially in a structure such as those having been assessed to have the porosity of 0.01 to 0.1%. Therefore, in the present invention, "fine structure" means, in the structure which has been assessed to have the porosity of 0.01 to 0.1%, the fine structure which is imparted with a further superior low-particle generation and is in the region where the difference in the luminance Sa is generated.

In this specification, "luminance value" is a value which is expressed by 256 gradations (0 to 255) in the color data of each pixel in the digital white and black image. Here, "gradations" is the stage of the brightness. Specifically, the numeral value expressing the color data of each pixel in the white and black image in accordance with 256 different brightness stages is called the luminance value (see "Image Processing Apparatus and the Use Method Thereof", p. 227, first ed., 1989, published by Nikkan Kogyo Shimbun, Ltd.). The contrast of white and black in the TEM white and black image is expressed as the luminance value.

In this specification, "luminance Sa" is obtained by applying the concept of Sa (arithmetical mean height of the surface), which is defined in the international standard ISO 25178 relating to a three-dimensional surface property, to the image processing of the digital TEM image. This will be specifically explained by using FIGS. 5A, 5B in which the luminance value of the digital TEM image is three-dimensionally displayed. FIG. 5A is the digital white and black image, which is the TEM bright-field image, of the structure. In this digital white and black image, the color data of each pixel is expressed with the numeral value of the gradations (0 to 255), and whereby FIG. 5B expresses these values in the Z-axis direction. Therefore, in FIG. 5B, the Z-axis is the luminance value, wherein the luminance value of each pixel in the X-Y plane is three-dimensionally expressed. The three-dimensional image of the luminance value is applied to the three-dimensional image of the surface property defined by ISO 25178, wherein to each of the assessment regions, an average of absolute values of differences of the luminance values in each pixel is calculated by using a least-square method; and the average value thereof is taken as "luminance Sa".

Next, "luminance Sa" in this specification is calculated roughly as follows.

In calculation of the luminance Sa in the present invention, the TEM observation sample to obtain the digital white and black image is prepared by using a focused ion beam method (FIB method) with suppressing a processing damage. During the FIB processing, a carbon layer and a tungsten layer are formed on surface of the structure for prevention of static charge and for sample protection. When a direction of the FIB processing is taken as a vertical direction, a sample's upper part thickness which is a length of a short axis direction of the structure surface in a plane perpendicular to the vertical direction is 100±30 nm. From one structure, at least three TEM observation samples are prepared.

The digital white and black image is obtained in each of the at least three TEM observation samples. The digital white and black image is obtained by using a transmission electron microscope (TEM) with a magnification of 100,000 and an acceleration voltage of 200 kV. The digital white and black image includes the structure, the carbon layer, and the tungsten layer.

In the digital white and black image, a luminance-obtaining region having a region's vertical length of 0.5 µm in the vertical direction from the surface of the structure is set. A plurality of the digital white and black images are obtained from each of the at least three TEM observation samples such that a total area of the luminance-obtaining regions may be 6.9 µm² or more.

The luminance value which is expressed by 256 gradations in the color data of each pixel in the digital white and black image is relatively corrected by using 255 as a luminance value of the carbon layer and 0 as a luminance value of the tungsten layer.

By using the corrected luminance value, the luminance Sa is calculated as follows. To each of the luminance-obtaining regions, an average of absolute values of differences of the luminance values after the correction in each pixel is calculated by using a least-square method, and the average thereof is taken as the luminance Sa.

Hereinafter, the calculation method of the luminance Sa will be explained in more detail with referring to FIG. 2 to FIG. 9.

Figure 2:
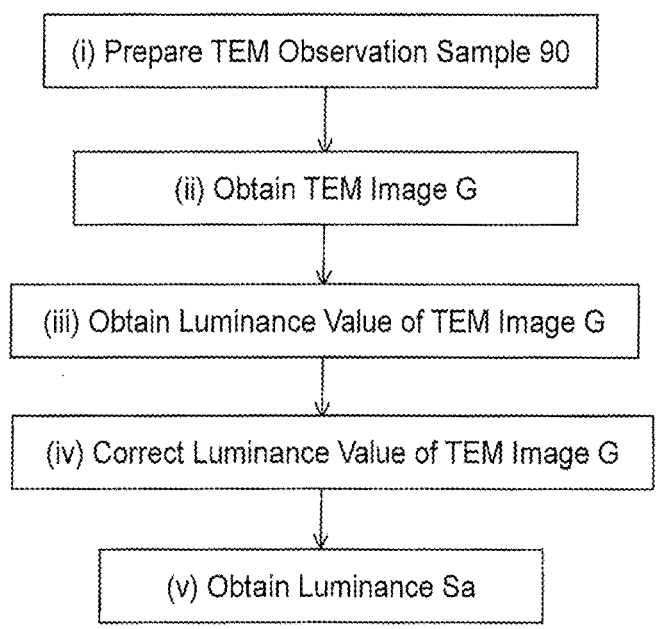
FIG. 2 is a flow chart illustrating the assessment method of the luminance Sa relating to the present invention.

FIG. 2 is a flow chart illustrating the calculation method of the luminance Sa.

(i): Preparation of the TEM Observation Sample

This step is to prepare the TEM observation sample. With referring to FIGS. 3A, 3B, this step will be explained. The TEM observation sample is prepared by the focused ion beam method (FIB method). In the step using the FIB method, a target part of the observation can be made thin ("Surface Analysis Technology Library; Transmission Electron Microscope", ed. by the Surface Science Society of Japan, Maruzen Corp., published in Mar. 30, 1999).

Figures 3A, 3B:
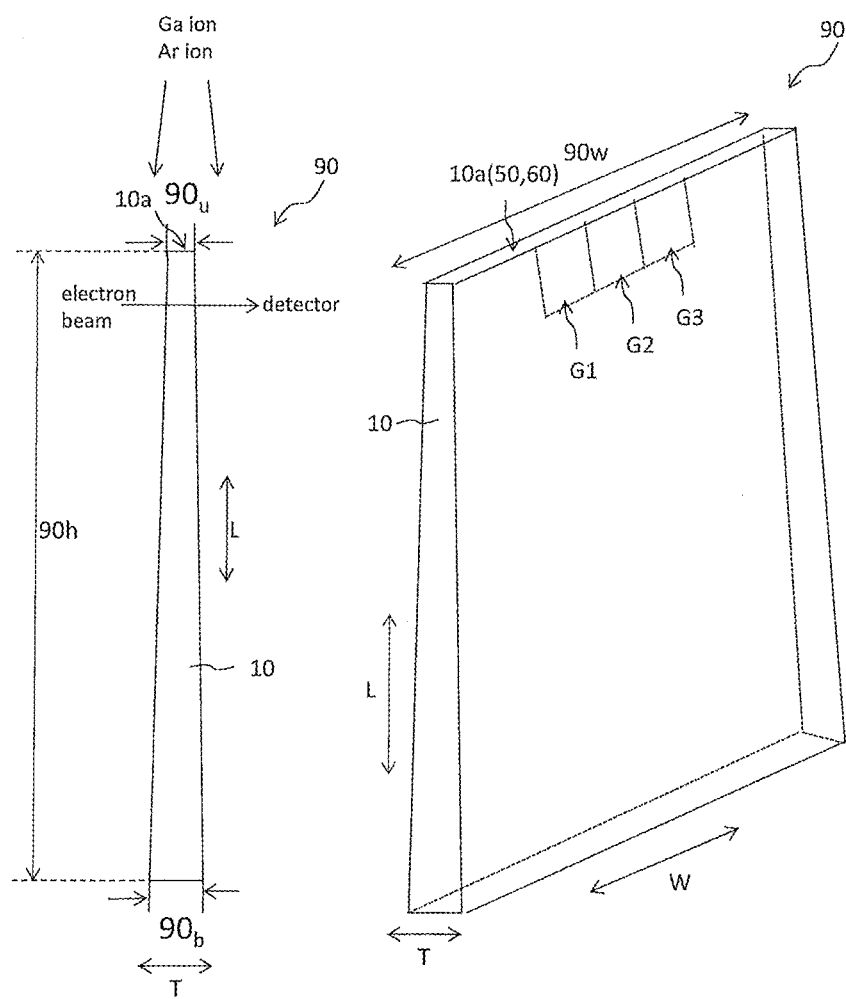
FIGS. 3A-3B are schematic drawings of a TEM observation of a specimen.
Figure 3C:
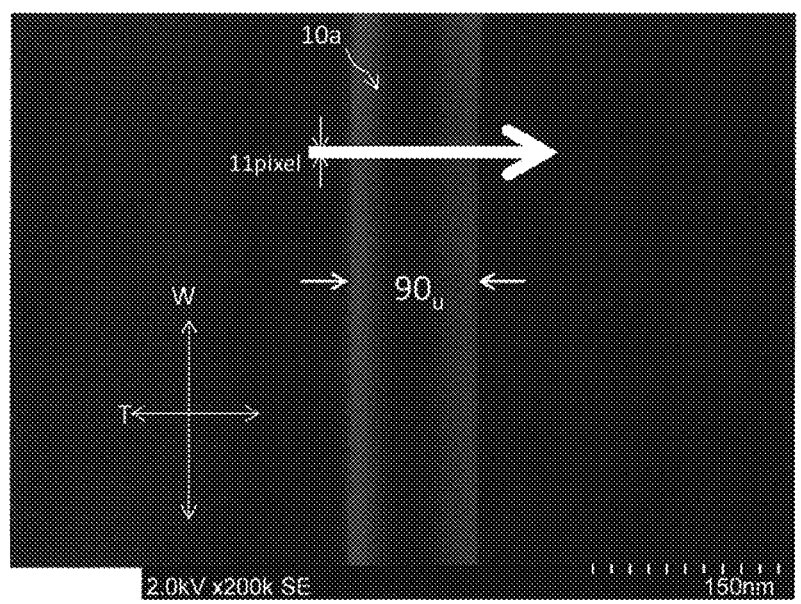
FIG. 3C is a secondary electron image of a scanning electron microscope (SEM) of a TEM observation sample.

First, in advance, the structure 10 is cut out by means of a dicing machine or the like. At this time, the portions corresponding to the sample-obtaining portions 40 of FIG. 8 and FIG. 9 to be mentioned later are cut out. Then, to the structure surface 10a, the FIB processing is carried out to obtain the shape of FIGS. 3A, 3B. At this time, the arrow L in FIGS. 3A, 3B is regarded as a vertical direction. The vertical direction L is almost in parallel with the thickness direction of the structure 10. Here, the vertical direction L is almost the same direction as the vertical direction defined in the FIB processing direction described before.

The FIB processing will be then explained in more detail. In order to suppress the charging-up and to protect the surface 10a of the structure 10, the carbon layer 50 is vapor-deposited onto the structure surface 10a having been subjected to the dicing processing. The vapor-deposition thickness of the carbon layer 50 is made to about 300 nm. Before forming the carbon layer 50, it is preferable to make the structure surface 10a flat and smooth by polishing or the like.

Next, the structure 10 having been vapor-deposited with the carbon layer 50 is made thin by using a focused ion beam (FIB) apparatus. Specifically, first, part of the structure 10 is cut out together with the carbon layer 50 by irradiating a Ga ion beam to around the portion to be made thin. At this time this is placed such that the side of the carbon layer 50 thereof is up. By means of an FIB pick-up method, the structure 10 thus having been cut out is fixed to a TEM sample holding plate for FIB by utilizing a tungsten deposition function. Next, in order to obtain the TEM observation sample 90, the structure 10 thus having been cut out is made to a thin piece. The procedure of making the thin piece is as follows. First, the tungsten layer 60 is formed by the tungsten deposition treatment on the carbon layer 50 of the structure 10 and on the portion to be made thin for the TEM observation. By forming the tungsten layer 60, breakage of the surface of the TEM observation sample due to the Ga ion beam can be suppressed during the processing. The thickness of the tungsten layer 60 to be vapor-deposited is in the range of 500 to 600 nm. The structure is shaved from both sides of the thinned portion thereof by means of the Ga ion to prepare the TEM observation sample 90 having a prescribed thickness (the length along the arrow T in the drawing).

In the present invention, the TEM observation sample 90 is prepared with suppressing the processing damage such as the irregularity damage of the processing surface. Specifically, during the FIB processing, the acceleration voltage is started with the maximum voltage of 40 kV, and finally, the finishing process is carried out with the minimum voltage of 5 kV in order to avoid the damage of the processing surface of the structure or to avoid formation of an amorphous layer as far as possible. Or finally, the damaged layer is removed by means of an Ar ion. The observation may be made after the surface thereof is cleaned with ion-milling. Details of the FIB processing can be referred to "Fine Processing Using the FIB Apparatus" (by Mitsuhiro Muroi, Tsukuba University Technical Report 24, 69-72, 2004) and "FIB Ion Milling Technology; Q&A" (by Masao Hirasaka and Kentaro Asakura, Agne Shofu Publishing Inc.).

FIG. 3A and FIG. 3B are schematic drawings of the TEM observation sample 90 that is obtained by the method as described above. As can be seen in FIG. 3A and FIG. 3B, the TEM observation sample 90 has a thin rectangular shape. In FIGS. 3A-3E, with regard to the two directions perpendicular to the vertical direction L, the long axis direction is regarded as the lateral direction W (arrow W in the drawing) and the short axis direction is regarded as the thickness direction T (arrow T in the drawing). As can be seen in FIG. 3A, in the TEM observation, an electron beam transmits in the thickness direction T.

As can be seen in FIG. 3A, because thinning by means of the Ga ion is made from top of the drawing, the sample 90 is prone to be larger in the lower part thickness 90b than the upper part thickness 90u. Here, the upper part thickness 90u is the length of the thickness direction T in the side of the surface 10a of the sample 90. The thickness of the TEM observation sample 90 influences the transmission ability of the electron beam. Specifically, when the sample thickness is too large, sensitivity of the luminance Sa decreases, so that there is a risk that the correlation with the low-particle generation cannot be obtained. When the sample thickness is too thin, the control of the thickness during processing is difficult so that the thickness fluctuates in the TEM observation sample 90; and thus, there is a risk that the correlation with the low-particle generation cannot be obtained. In the present invention, the upper part thickness 90u is preferably 100 nm±30 nm, while more preferably 100 nm±20 nm.

In the present invention, in order to calculate the luminance Sa by means of the image analysis using the TEM digital white and black image, the processing is carried out such that the difference in the thickness along the vertical direction L of the TEM observation sample 90 (difference between the upper part thickness 90u and the lower part thickness 90b) be as small as possible. Usually, the sample is made to have the form shown in FIG. 3A, wherein the sample height 90h (length of the vertical direction L) is made to about 10 μm, and the sample width 90w (length of the lateral direction W) is made in the range of about ten micrometers to about several ten micrometers.

The confirmation method of the upper part thickness 90u of the TEM observation sample 90 is as follows. By using a scanning electron microscope (SEM), the secondary electron image (see FIG. 3C) of the TEM observation sample is obtained thereby obtaining the upper part thickness 90u from this secondary electron image. As to the SEM, for example, S-5500 (manufactured by Hitachi, Ltd.) is used. The SEM observation conditions with the magnification of 200,000, the acceleration voltage of 2 kV, the scanning time of 40 seconds, and the image number of 2560×1920 pixels are used. At this time, the SEM image is arranged so as to be a flat plane which is perpendicular to the vertical direction L. By using the scale bar in the SEM image, the upper part thickness $90u$ is obtained. The upper part thickness $90u$ is obtained as the average value of 5 measurements.

In addition, an alternative confirmation method of the upper part thickness $90u$ is as follows. Namely, in the digital image of the secondary electron image, the luminance value is measured along the thickness direction T so as to obtain a luminance line profile. At this time, the line width is made to 11 pixels, and the average value of the luminance values of 11 pixels in the line width direction is used. An example of the luminance line profile thereby obtained is shown in FIG. 3D. Next, the luminance line profile is primarily differentiated, and the maximum value and the minimum value of the primary differentiation are taken as the edges of the structure 10; and thus, the upper part thickness $90u$ of the structure 10 is obtained (see FIG. 3E). At this time, the upper part thickness $90u$ is the average value of 5 luminance line profiles.

In calculation of the luminance Sa in the present invention, at least three TEM observation samples 90 are prepared from one composite structure. Preparation of the at least three TEM observation samples will be further explained by using FIG. 8 and FIG. 9.

FIG. 8 and FIG. 9 are schematic drawings of the examples in which the composite structure 100 is used as the semiconductor manufacturing apparatus component 301. In FIG. 8, in the semiconductor manufacturing apparatus component 301, the structure 10 is formed on the surface 70a of the columnar substrate 70. In FIG. 9, in the semiconductor manufacturing apparatus member 302, the structure 10 is formed on the surface 70a of the columnar substrate 70 having the hole 31 in the central part thereof.

In the semiconductor manufacturing apparatus components 301 and 302, the surface 10a of the structure 10 is exposed to corrosive plasma. The semiconductor manufacturing apparatus components 301 and 302 are, for example, the members which constitute an inner wall of an etching chamber, such as a shower plate, a focus ring, a window, or a sight glass. When the structure 10 has the plasma exposed area 30a and the plasma non-exposed area 30b, the sample-obtaining portion 40 for the luminance Sa measurement is set in the portion corresponding to the plasma exposed area 30a. At this time, if there is an area which is exposed with an especially large amount of plasma, the structure surface 10a corresponding to this area is set to the sample-obtaining portion 40 so as to enhance the correlation between the low-particle generation and the luminance Sa.

In the present invention, the number of the sample-obtaining portion 40 for the luminance Sa measurement to prepare the TEM observation sample 90 is at least three. At this time, as can be seen in FIG. 8 and FIG. 9, the plural sample-obtaining portions 40 each are equally provided in the plasma exposed area 30a. By so doing a high correlation between the luminance Sa of the composite structure 100 and the low-particle generation can be guaranteed.

(ii): Obtaining the TEM Image G (Bright-Field Image)

Figure 4:
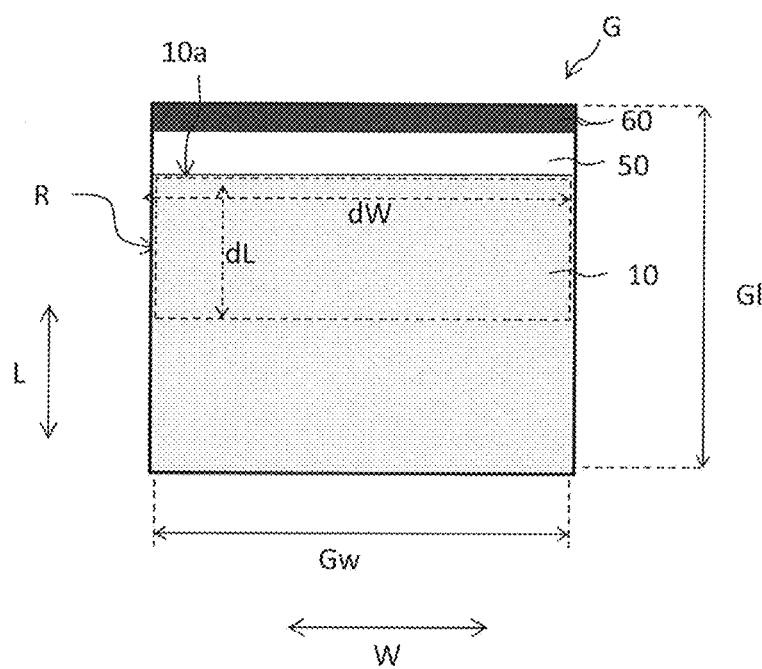
FIG. 4 is a schematic drawing of the TEM image G of the structure 10.

In this step, in each of the at least three TEM observation samples 90 obtained in (i), the cross section thereof is observed with TEM with the photographing magnification of 100,000 and the acceleration voltage of 200 kV to obtain the TEM image G including the structure 10, the carbon layer 50, and the tungsten layer 60 (see FIG. 4). The cross section of the TEM observation sample 90 is, namely, the cross section of the composite structure 100 depicted in FIG. 1; more specifically, it is the cross section including around the surface 10a of the structure 10. At this time, the bright-field image is obtained. The bright-field image is the image formed when only a transmitted beam passes through the objective aperture ("Surface Analysis Technology Library; Transmission Electron Microscope", ed. by the Surface Science Society of Japan, p. 43-44, Maruzen Corp., published in Mar. 30, 1999).

When photographing the TEM image G, for example, a transmission electron microscope (H-9500; manufactured by Hitachi High-Technologies Corp.) is used with the acceleration voltage of 200 kV. Photographing is carried out by using a digital camera (One View Camera Model 1095; manufactured by Gatan, Inc.) under the conditions equivalent to the following conditions: the shooting pixels of 4096×4096, the capture speed of 6 fps, the setting of the image capture mode being the exposure time of 2 seconds, and the bottom mount camera position. As depicted in FIG. 4, this image G is obtained such that the structure 10, the structure surface 10a, the carbon layer 50, and the tungsten layer 60 may be in the same view field.

In the present invention, the luminance Sa is calculated by means of the image analysis of the luminance information of the digital image. Because of this, the focus accuracy in photographing is very important. Therefore, for example, when the TEM image with the magnification of 100,000 is obtained, the TEM image with the magnification of 100,000 is obtained after focusing with a high magnification of 300,000 or more.

The TEM image G, which is the digital white and black image, will be further explained by using FIG. 4. FIG. 4 is a schematic drawing of the TEM image G (bright-field image). In the drawing, the rectangular portion with the vertical length G1 and the lateral length Gw is the TEM image G. In FIG. 4, on the surface 10a of the structure 10, there are the images corresponding to the carbon layer 50 and the tungsten layer 60, the both being vapor-deposited in the step (i). The portion below the surface 10a corresponds to the structure 10. In the TEM image G, the carbon layer 50 is white to pale grey, and the tungsten layer 60 is black.

In this specification, note that in the TEM image G, the direction that the structure 10, carbon layer 50, and the tungsten layer 60 are arranged, namely, the direction indicated by the arrow L in FIG. 4, is called "vertical direction", and the arrow W direction in the drawing, which is perpendicular to "vertical direction" is called "lateral direction". This vertical direction L corresponds to the vertical direction L in FIG. 3A-3E.

The physical properties and characteristics of the composite structure of the present invention, for example, the low-particle generation is controlled by the condition around the surface of the structure. The inventors of the present invention found that the luminance Sa in the region in which the region's vertical length dL along the vertical direction L from the structure surface 10a is 0.5 μm was best correlated to the physical properties and characteristics, for example, to the low-particle generation. The image's vertical direction length G1 and the image's lateral direction length Gw in the TEM image obtained with the magnification of 100,000 each are generally in the range of about 1.5 μm to about 2.0 μm, though depending on the camera. Therefore, in the present invention, the luminance-obtaining region R is set with the region's vertical length dL of 0.5 μm by using the TEM image with the magnification of 100,000; and the luminance Sa is determined from the luminance value in this luminance-obtaining region R.

In the present invention, the luminance-obtaining region R is set in each image G. Then, plural digital white and black images are obtained from each of the at least three TEM observation samples such that the total area of the luminance-obtaining regions R may be 6.9 µm² or more. At this time, the number of the image G to be obtained from each TEM observation image should be the same. Details of the total area of the luminance-obtaining regions R will be described later.

(iii): Obtaining the Luminance Value

Then, in this step, in each axis of "vertical direction" and "lateral direction" in the TEM image G, which is the digital white and black image obtained in the step (ii), the luminance value of each pixel corresponding thereto is obtained. In this, the luminance value of the tungsten layer and the luminance value of the carbon layer in the image G are included. FIG. 5A is a plan view of one example of the obtained TEM image G. The arrow Y of FIG. 5A corresponds to the vertical direction L in FIGS. 3A-3B and FIG. 4. The arrow X in FIG. 5A corresponds to the lateral direction W in FIGS. 3A-3B and FIG. 4. FIG. 5B is the drawing in which the luminance values of each pixel are expressed three-dimensionally in the arrow Z direction in the image G.

(iv): Step to Correct the Luminance Value

Then, in this step, the correction operation of the luminance value of the TEM image G obtained in the step (iii) is carried out. The specific content of the operation will be explained by using FIGS. 6A-6B. FIG. 6A is the drawing in which the luminance values of the TEM image G obtained in the step (iii), i.e., the luminance values of each pixel corresponding to the axes of the vertical direction and the lateral direction of the structure 10, are expressed three-dimensionally. In this, similarly to the step (iii), the luminance value of the tungsten layer and the luminance value of the carbon layer in the image G are included. In this step, the luminance value corresponding to the structure 10 is relatively corrected in each pixel by using 256 gradations where as a 0 gradation the luminance value of the tungsten layer 60 in the image G is set and a 255 gradation the luminance value of the carbon layer 50 in the image G is set. As described above, in the TEM image G, the tungsten layer 60 is black and the carbon layer 50 is white to grey. In this step, between the luminance value 0 of the tungsten layer and the luminance value 255 of the carbon layer, the luminance value of each pixel in the structure 10 is corrected and determined as the relative value. FIG. 6B expresses three-dimensionally the luminance values of the image G after correction. When comparing with FIGS. 5A-5B, it can be seen that the luminance values in the structure 10 are relatively corrected on the basis of black in the tungsten layer 60 and white to grey in the carbon layer 50.

Usually, in the TEM image G, there is a little bit of fluctuation in the luminance value in each pixel of the carbon layer 50/tungsten layer 60. In order to remove the influence of this fluctuation, the values of the luminance value 0 of the tungsten layer and the luminance value 255 of the carbon layer are determined as follows. For the luminance value of the tungsten layer 60, an average value of the luminance values of 10,000 pixels in order continuously from the minimum luminance value in the tungsten layer 60 of the image G is used. For the luminance value of the carbon layer 50, an average value of the luminance values of 100,000 pixels in order continuously from the maximum luminance value in the carbon layer 50 is used. The average values thereby obtained are used as the luminance values of the carbon layer 50/tungsten layer 60 before the correction. With regard to the plural TEM images G, too, the luminance values are similarly corrected.

(v): Calculation of the Luminance Sa

In this step, the luminance Sa is calculated from the luminance values of the image G obtained in the step (iv). Specifically, to each of the luminance-obtaining regions R (hereinafter, each of the luminance-obtaining regions is expressed by $R_n$), an average of absolute values of differences of the luminance values after the correction in each pixel is calculated by using a least-square method, and the average thereof is taken as the luminance $Sa_n$ of the region $R_n$. Then, the average value of the luminance $Sa_n$ that is calculated in plural luminance-obtaining regions $R_n$ in which the total area of the luminance-obtaining regions $R_{1+2+...+n}$ is set so as to be 6.9 µm² or more is taken as the luminance Sa of the structure 10.

In the present invention, in order to enhance the relationship between the luminance Sa and the physical properties and characteristics of the structure, for example, the low-particle generation, the area of the luminance-obtaining area R is made to 6.9 µm² or more when calculating the luminance Sa. When the luminance Sa is determined on the basis of the area more than this area, the relationship between the luminance Sa and the physical properties can be expressed accurately and properly even in the case where there is a possibility of causing fluctuation of the physical properties and characteristics in the limited area of the structure 10.

The size of one TEM observation sample 90 is very small relative to the surface area of the structure 10, namely, to the plasma-exposed area. On the other hand, the physical properties and characteristics imparted to the structure, such as, for example, the low-particle generation, are required, in principle, to cover the entire surface of the structure. Because of this, in the present invention, the total area of 6.9 µm² or more is required in the luminance-obtaining area R, and also, at least three TEM observation samples are prepared from the structure 10. Namely, in the present invention, plural TEM observation samples are equally obtained from the structure surface so as to cover the information of the entire surface of the structure as far as possible. In addition, when obtaining the at least three TEM observation samples, a care needs to be paid so as to cover the information of the entire structure surface.

The luminance Sa is correlated with the physical properties and characteristics provided for the structure, for example, the low-particle generation. Therefore, according to the present invention, the performance such as the low-particle generation of the structure can be grasped before the use thereof by calculating the luminance Sa of the structure in place of an actual assessment of the low-particle generation of the structure.

The calculation step of the luminance Sa will be explained in more detail, mainly focusing on the area of the luminance-obtaining region R.

In the present invention, in order to enhance the relationship between the luminance Sa and the low-particle generation, the total area of the luminance-obtaining regions R in the image G is set to 6.9 µm² or more. Specifically, plural images G, (n images) are obtained from the at least three TEM observation samples, whereby the region $R_n$ is set in each image. Then, the average value of the luminance $Sa_n$ of each G, is taken as the luminance Sa of the structure.

With referring to FIG. 4, FIG. 6A, and FIGS. 7A to 7B, the method to calculate the luminance $Sa_1$ from one image $G_1$ will be explained.

As illustrated in FIG. 4 and FIG. 6A, the region $R_1$ is set to one image $G_1$. In one region $R_1$, the region's vertical length dL is made to 0.5 µm. As described before, this is because it is presumed that the condition around the surface of the structure is best correlated with the physical properties and characteristics of the structure, for example, the low-particle generation. The region's lateral length dW in the lateral direction W of the region $R_1$ is set so as to be the longest in the image G. For example, the region's lateral length dW is about 1.5 μm to about 2.0 μm with the magnification of 100,000. In other words, the settable area of the region $R_1$ in one TEM image $G_1$ photographed with the magnification of 100,000 is 0.75 to 1.0 μm$^2$.

Accordingly, in this example, in order to obtain 6.9 μm$^2$ as the total area of the luminance-obtaining regions $R_n$, 7 to 9 images G are necessary. On the other hand, in the present invention, as described before, at least three TEM observation samples 90 are prepared, and the same numbers of the TEM image G are obtained from each of the TEM observation samples 90. Therefore, in this example, three images G are obtained from one TEM observation sample 90. When plural TEM images $G_n$, are obtained from one TEM observation sample 90, the plural images $G_n$, are obtained so as to be continuous in the lateral direction W, as illustrated in FIG. 3B. In addition, the size (the image's vertical direction length G1 and the image's lateral direction length Gw) of the plural images $G_n$, are made almost the same in each. By so doing, for example, the effect of the measurement fluctuation among observes can be decreased so that the correlation between the luminance Sa and the low-particle generation can be enhanced furthermore.

As described above, the inventors of the present invention found that the luminance Sa in the 0.5 μm region from the structure surface 10a has the best correlation with the physical properties and characteristics of the structure, for example, the low-particle generation. Because of it, in the region R to calculate the luminance Sa, the region's vertical length dL is made to 0.5 μm. In addition, in the step (i), as explained in FIGS. 3A-3E, the structure 10 is processed from the direction of the surface 10a; and thus, even in the case when the processing precision is enhanced, a tapered form that the sample's lower part thickness 90b is larger than the sample's upper part thickness 90u is obtained in the TEM observation sample 90. Therefore, as the depth from the surface 10a of the structure 10 increases, transmission of the electron beam becomes more difficult so that the sensitivity of the luminance value decreases. In other words, in the image G, as moving to the depth direction from the side of the surface 10a, the image becomes darker as a whole, namely, the image becomes more blackish. Accordingly, in order to sufficiently lower the effect of the sample thickness, the region's vertical length dL needs to be 0.5 μm.

When setting the luminance-obtaining region R, the region's vertical length dL is set from the base point which is near to the surface 10a of the structure 10. In the case when a space is observed between the surface 10a and the carbon layer 50 in the TEM image G, the region R needs to be set so as to avoid this space. "Near to the surface 10a" means within the range about 5 to about 50 nm from the surface 10a. Details of specific setting may be referred to Examples to be described later.

The steps (iii) to (iv) may be carried out continuously and altogether by using image analysis software. As the example of the software like this, WinROOF 2015 (available from Mitani Corp.) may be mentioned.

Here, it is presumed that the smaller the luminance Sa which is provided for the structure of the composite structure of the present invention is, the better the structure is; however, it is clear among those skilled in the art that there is actually a limit value in the production thereof. Therefore, in the present invention, the limit like this in the production is the lower limit value of the luminance Sa; and thus, not specifying the lower limit value does not obscure the present invention according to the third aspect. The same is true in a fourth aspect described later.

Fourth Aspect of the Present Invention

In a fourth aspect of the present invention, similarly to the third aspect of the present invention, the luminance Sa is used as the index, wherein this aspect is characterized by that a process to remove noise components is added in the step (iv) of the method to obtain the luminance Sa in the third aspect, namely in the step to correct the luminance value. Accordingly, the explanation of the third aspect in this specification other than the step to remove the noise components becomes the explanation of the fourth aspect.

According to a fourth aspect of the present invention, there is provided a composite structure comprising a substrate and a structure which is provided on the substrate and has a surface; wherein the structure comprises a polycrystalline ceramic; and a luminance Sa calculated by a following method is 10 or less, where the method to obtain the luminance Sa comprises the steps of:

(i) preparing a transmission electron microscope (TEM) observation sample of the structure, (ii) preparing a digital white and black image of a bright-field image of the TEM observation sample, (iii) obtaining a luminance value which is expressed by 256 gradations in color data of each pixel in the digital white and black image, (iv) correcting the luminance value, and (v) calculating the luminance Sa by using the luminance value after the correction; and in the step (i), as the TEM observation sample, at least three samples are prepared from the structure, the at least three TEM observation samples each are prepared by using a focused ion beam method (FIB method) with suppressing a processing damage, during the FIB processing, a carbon layer and a tungsten layer are formed on surface of the structure for prevention of static charge and for sample protection, and when a direction of the FIB processing is taken as a vertical direction, an upper part thickness of the sample, which is a length of a short axis direction of the structure surface in a plane perpendicular to the vertical direction is 100±30 nm; and in the step (ii), the digital white and black image is obtained in each of the at least three TEM observation samples, each of the digital white and black images is obtained by using a transmission electron microscope (TEM) with a magnification of 100,000 and an acceleration voltage of 200 kV, and the image includes the regions of the structure, the carbon layer, and the tungsten layer, in each of the digital white and black images, a region for obtaining a luminance (a luminance-obtaining region), which has a region's vertical length of 0.5 μm in the vertical direction from the surface of the structure is set, and a plurality of the digital white and black images are obtained from each of the at least three TEM observation samples such that a total area of the luminance-obtaining regions may be 6.9 μm$^2$ or more; and in the step (iv), the luminance values are relatively corrected by using 256 gradations where as a 255 gradation a luminance value of the carbon layer is set and as a 0 gradation a luminance value of the tungsten layer is set in order to give a luminance value after correction; and from the digital white and black image having the luminance value corrected, a noise is removed by using a low-pass filter in which a cut-off frequency in the noise removal using the low-pass filter is 1/(10 pixels); and in the step (v), for each of the luminance-obtaining regions, an average of absolute values of differences of the luminance values after the correction in each pixel is calculated by using a least-square method, and an average thereof is taken as the luminance Sa.

According to the present invention, there is also provided a method for assessing a fine structure of a structure which comprises a polycrystalline ceramic and has a surface, wherein the method comprises the steps of:

(i) preparing a transmission electron microscope (TEM) observation sample of the structure, (ii) preparing a digital white and black image of a bright-field image of the TEM observation sample, (iii) obtaining a luminance value which is expressed by 256 gradations in color data of each pixel in the digital white and black image, (iv) correcting the luminance value, and (v) calculating the luminance Sa by using the luminance value after the correction; and in the step (i), as the TEM observation sample, at least three samples are prepared from the structure, the at least three TEM observation samples each are prepared by using a focused ion beam method (FIB method) with suppressing a processing damage, during the FIB processing, a carbon layer and a tungsten layer are formed on surface of the structure for prevention of static charge and for sample protection, and when a direction of the FIB processing is taken as a vertical direction, an upper part thickness of the sample, which is a length of a short axis direction of the structure surface in a plane perpendicular to the vertical direction is 100±30 nm; and in the step (ii), the digital white and black image is obtained in each of the at least three TEM observation samples, each of the digital white and black images is obtained by using a transmission electron microscope (TEM) with a magnification of 100,000 and an acceleration voltage of 200 kV, and the image includes the regions of the structure, the carbon layer, and the tungsten layer, in each of the digital white and black images, a region for obtaining a luminance (a luminance-obtaining region), which has a region's vertical length of 0.5 μm in the vertical direction from the surface of the structure is set, and a plurality of the digital white and black images are obtained from each of the at least three TEM observation samples such that a total area of the luminance-obtaining regions may be 6.9 μm² or more; and in the step (iv), the luminance values are relatively corrected by using 256 gradations where as a 255 gradation a luminance value of the carbon layer is set and as a 0 gradation a luminance value of the tungsten layer is set in order to give a luminance value after correction; and from the digital white and black image having the luminance value corrected, a noise is removed by using a low-pass filter in which a cut-off frequency in the noise removal using the low-pass filter is 1/(10 pixels); and in the step (v), for each of the luminance-obtaining regions, an average of absolute values of differences of the luminance values after the correction in each pixel is calculated by using a least-square method, and an average thereof is taken as the luminance Sa.

As described above, the composite structure according to the fourth aspect is characterized by that the luminance Sa is 10 or less, while preferably 5 or less.

In the fourth aspect of the present invention, similarly to the third aspect of the present invention, in order to obtain the luminance Sa, the step (i), namely, the process in which a transmission electron microscope (TEM) observation sample of the structure is prepared, the step (ii), namely, the step in which a digital white and black image of a bright-field image of the TEM observation sample is prepared, and the step (iii), namely, the step in which a luminance value which is expressed by a numeral value of a tone in the color data of each pixel in the digital white and black image is obtained are carried out. And in addition, in the step (iv), in order that the luminance Sa exhibits the fine structure of the structure more accurately and properly, a step to remove a noise component in the image is carried out, as needed. The TEM image G includes noises having high frequency components so that these are removed by a filter in this additional step. In this aspect, the noise removal in the image G is carried out by using a low-pass filter (LPF). Details of the noise removal in the image processing can be referred to "Image Processing—From Basic to Application, Second Ed." (by Hiroshi Ozaki and Yoshiharu Taniguchi, Kyoritsu Shuppan Co., Ltd.).

In this aspect, in the noise removal using the low-pass filter, the cut-off frequency of 1/(10 pixels) is used. Namely, the cut-off frequency is made to 10 pixels. For example, when WinROOF 2015 is used as the image processing software, the cut-off frequency is set by using a noise removal command.

FIG. 7C and FIG. 7D are the example of the image in which by using the low-pass filter with the cut-off frequency of 1/(10 pixels), the noises are removed against FIG. 7A and FIG. 7B, which are the image G after correction of the luminance value. By removing the noises, the effect due to the focus accuracy or the like of the TEM image G can be removed, so that the correlation between the luminance Sa and the physical properties and characteristics provided for the structure, for example, the low-particle generation, can be enhanced.

Thereafter, in the fourth aspect of the present invention, the step (v) in which the luminance Sa is calculated by using the luminance value obtained after the correction is carried out. The step (v) may also be made to the same as that of the third aspect of the present invention.

Fifth Aspect of the Present Invention

In a fifth aspect of the present invention, contrary to the first to fourth aspects of the present invention, with limiting the target to the structure including Y (yttrium element) and O (oxygen element), the fine structure of the structure is expressed with a refractive index as the index. Namely, the inventors of the present invention succeeded to significantly reduce the effect of the particle generation in the composite structure which is provided with the structure including Y (yttrium element) and O (oxygen element) and is used under the situation that a semiconductor manufacturing apparatus or the like is exposed, for example, to a corrosive atmosphere. Also, it was found that by using the refractive index as the index, the low-particle generation could be assessed in a very high accuracy level.

According to a fifth aspect of the present invention, there is provided a composite structure comprising a substrate and a structure which is provided on the substrate and has a surface, wherein the structure comprises a polycrystalline ceramic comprising Y (yttrium element) and O (oxygen element);

a refractive index thereof in a wavelength range of 400 nm to 550 nm is more than 1.92;

the refractive index is calculated by a reflection spectroscopy using a microscopic spectroscopy film thickness meter;

where as measurement conditions a measurement spot size is 10 μm, an average surface roughness Ra of a surface of the substrate and of a surface of the composite structure each is 0.1 μm or less, a thickness of the structure is 1 μm or less, and a range of measurement wavelength is 360 to 1100 nm; and as an analysis condition an analysis wavelength range is 360 to 1100 nm using an optimization method and a least-square method.

According to another fifth aspect of the present invention, there is provided a composite structure comprising a substrate and a structure which is provided on the substrate and has a surface, wherein the structure comprises a polycrystalline ceramic comprising Y (yttrium element) and O (oxygen element);

a refractive index thereof satisfies at least any of 1.99 or more at a wavelength of 400 nm, 1.96 or more at a wavelength of 500 nm, 1.94 or more at a wavelength of 600 nm, 1.93 or more at a wavelength of 700 nm, and 1.92 or more at a wavelength of 800 nm or more;

the refractive index is calculated by a reflection spectroscopy using a microscopic spectroscopy film thickness meter;

where as measurement conditions a measurement spot size is 10 μm, an average surface roughness Ra of a surface of the substrate and of a surface of the composite structure each is 0.1 μm or less, a thickness of the structure is 1 μm or less, and a range of measurement wavelength is 360 to 1100 nm; and as an analysis condition an analysis wavelength range is 360 to 1100 nm using an optimization method and a least-square method.

Figure 20:
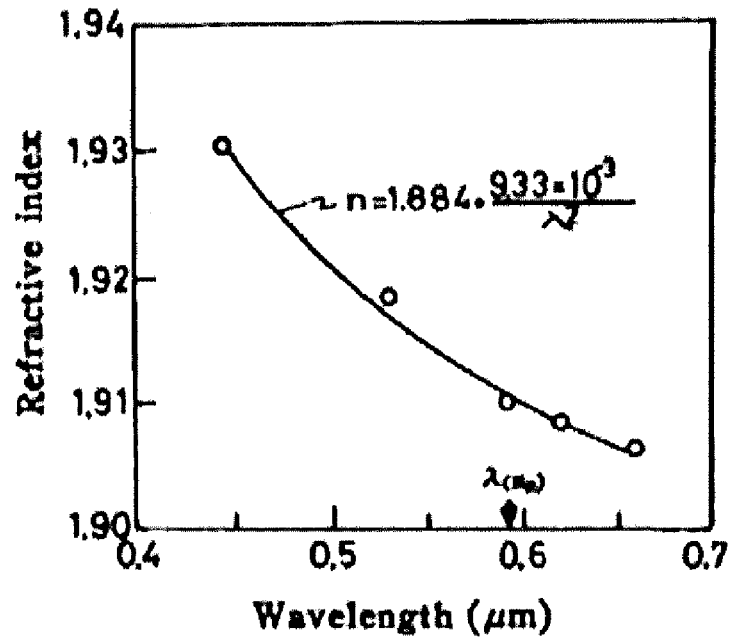
FIG. 20 is the graph illustrating the chromatic dispersion of the refractive index of the yttrium oxide sintered body relating to a conventional technology.

In general, an average refractive index of $Y_2O_3$ is 1.92 ("Handbook of Chemistry", ed. by the Chemical Society of Japan, Maruzen Corp., p. 919 (1962); "Ceramic Chemistry" by the Ceramic Society of Japan, Tables 8-24, p. 220, revised in Sep. 30, 1994). Bulletin of the Chemical Society of Japan (pp 1106-1108, 1979 (8), "Refractive Index and Reflectance of Yttrium Oxide Sintered Body") discloses the refractive index and the reflectance as the optical characteristics of an yttrium oxide sintered body, which is a transparent plate-like sample (see FIG. 20). On the contrary, in the composite structure according to the fifth aspect of the present invention, the refractive index, for example, in the wavelength range of 400 to 550 nm, is more than 1.92. Alternatively, the refractive index thereof satisfies at least any of 1.99 or more at a wavelength of 400 nm, 1.96 or more at a wavelength of 500 nm, 1.94 or more at a wavelength of 600 nm, 1.93 or more at a wavelength of 700 nm, and 1.92 or more at a wavelength of 800 nm or more.

In the fifth aspect, a basic structure of the composite structure is the same as the composite structure according to the first to fourth aspects; however, in the basic structure in FIG. 1, the structure 10 in this aspect includes a polycrystalline ceramic including Y (yttrium element) and O (oxygen element) (hereinafter, this is called "Y—O compound", as the case may be), and, the structure 10 which is provided for the composite structure shows a prescribed refractive index.

Therefore, the structure 10 according to the fifth aspect, which includes Y (yttrium element) and O (oxygen element), the structure being provided for the composite structure, is a so-called Y—O compound coat. By forming the Y—O compound coat, the substrate 70 can be imparted with various physical properties and characteristics. Note that in this aspect, too, the ceramic structure and the ceramic coat are used with the same meaning unless otherwise specifically noted.

According to one preferred aspect herein, the structure 10 is formed of mainly a polycrystalline ceramic including the Y—O compound, wherein the content of the Y—O compound therein is preferably more than 50%, more preferably 70% or more, far preferably 90% or more, while particularly preferably 95% or more. The most preferably the structure 10 is formed of the Y—O compound.

In this aspect, the Y—O compound is, for example, an oxide of yttrium. Illustrative example thereof includes $Y_2O_3$ and $Y_\alpha O_\beta$ (non-stoichiometric composition). This compound may include elements other than the Y element and the O element. For example, the Y—O compound further including at least any of an F element, a Cl element, and a Br element may be cited. The structure 10 is mainly composed of, for example, $Y_2O_3$. The content of $Y_2O_3$ is 70% or more, preferably 90% or more, while more preferably 95% or more. The most preferably the structure 10 is composed of 100% of $Y_2O_3$.

Refractive Index in the Fifth Aspect

The refractive index may be measured and calculated by using a microscopic spectroscopy film thickness meter (for example, OPTM-F2, FE-37S; manufactured by Otsuka Electronics Co., Ltd.) and a reflection spectroscopy. As the measurement conditions, the measurement spot size of 10 μm and the measurement wavelength range of 360 to 1100 nm are used. As the analysis conditions, the analysis wavelength range of 360 to 1100 nm, and an optimization method as well as a least-square method are used.

In the composite structure according to the fifth aspect of the present invention, the refractive index in the wavelength range of 400 nm to 550 nm is more than 1.92, preferably more than 1.92 in the wavelength range of 400 nm to 600 nm, while more preferably more than 1.92 in the wavelength range of 400 nm to 800 nm. In addition, in the composite structure according to the fifth aspect of the present invention, the refractive index thereof satisfies at least any of 1.99 or more at a wavelength of 400 nm, 1.96 or more at a wavelength of 500 nm, 1.94 or more at a wavelength of 600 nm, 1.93 or more at a wavelength of 700 nm, and 1.92 or more at a wavelength of 800 nm or more. In the composite structure including the Y—O compound, the inventors of the present invention newly found a novel structure which can increase the refractive index as described above. In addition, contrary to our expectation, it was found that the composite structure which includes the Y—O compound and has a very high refractive index had an excellent low-particle generation. With these findings, the present invention was conceived. In a preferable aspect of the present invention, the upper limit of the refractive index is 2.20.

Preparation Method of the Composite Structure

The composite structure according to the present invention may be produced with various suitable production methods so far as those which are provided with the indexes according to the first to fifth aspects can be realized. According to one aspect of the present invention, the composite structure according to the present invention may be preferably produced by forming the structure on the substrate by means of an aerosol deposition method (AD method).

According to one preferable aspect of the present invention, the structure of the composite structure according to the present invention may be realized by the AD method. In the AD method, an aerosol obtained by mixing a gas with fine particles of a brittle material such as a ceramics is ejected to the substrate surface thereby causing collision of the fine particles to the substrate at a high collision speed. With this collision, the fine particles are fractured or deformed so as to form the structure (ceramic coat) onto the substrate.

Apparatus to Carry Out the AD Method

Figure 10:
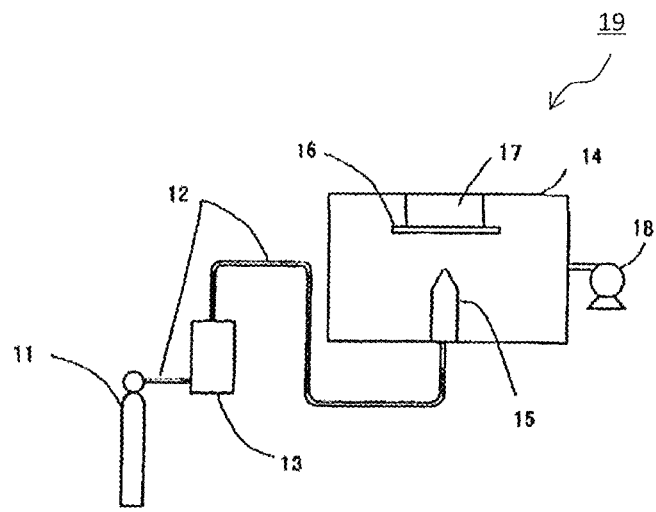
FIG. 10 is a schematic drawing illustrating one example of the apparatus composition used in the aerosol deposition method.

The apparatus to be used in the AD method for producing the composite structure according to the first to fifth aspects of the present invention is not particularly restricted, though the apparatus is provided with basic components described in FIG. 10. Namely, the apparatus 19 to be used in the AD method is composed of the chamber 14, the aerosol-supplying unit 13, the gas-supplying unit 11, the exhausting unit 18, and the piping 12. Inside the chamber 14 are provided the stage 16 to which the substrate 70 is provided, the driving unit 17, and the nozzle 15. By means of the driving unit 17, the position between the nozzle 15 and the substrate 70 that is provided to the stage 16 can be relatively changed. At this time, the distance between the nozzle 15 and the substrate 70 may be made either constant or variable. In this example, the aspect is illustrated wherein the driving unit 17 drives the stage 16; but the driving unit 17 may drive the nozzle 15. The driving direction is, for example, an XYZθ direction.

In the apparatus of FIG. 10, the aerosol-supplying unit 13 is connected to the gas-supplying unit 11 through the piping 12. In the aerosol-supplying unit 13, an aerosol obtained by mixing raw material fine particles with a gas is supplied to the nozzle 15 through the piping 12. The apparatus 19 is further provided with a powder-supplying unit to supply the raw material powders (not shown in the drawing). The powder-supplying unit may be provided either in the aerosol-supplying unit 13 or separately from the aerosol-supplying unit 13. Besides the aerosol-supplying unit 13, an aerosol-forming unit in which the raw material fine particles and the gas are mixed may be provided. When the supplying amount from the aerosol-supplying unit 13 is controlled such that the amount of the fine particles ejected from the nozzle 15 may be constant, the homogeneous structure can be obtained.

The gas-supplying unit 11 supplies a nitrogen gas, a helium gas, an argon gas, an air, or the like. In the case that the gas to be supplied is an air, it is preferable that, for example, either a compressed air in which impurities such as moisture and oil are reduced be used or an air-treatment unit with which the impurities are removed from an air be provided additionally.

The action of the apparatus 19 to be used in the AD method will be explained below. Under the state that the substrate is provided to the stage 16 in the chamber 14, inside the chamber 14 is evacuated by means of the exhausting unit 18 such as a vacuum pump until the pressure becomes lower than an atmospheric pressure, specifically until about several hundred Pa. On the other hand, an inner pressure of the aerosol-supplying unit 13 is set to a pressure higher than the inner pressure of the chamber 14. The inner pressure of the aerosol-supplying unit 13 is, for example, in the range of several hundred Pa to several ten thousand Pa. The pressure of the powder-supplying unit may be made to an atmospheric pressure. By means of, for example, the pressure difference between the chamber 14 and the aerosol-supplying unit 13, an ejection speed of the fine particles in the aerosol is accelerated such that the ejection speed of the raw material particles from the nozzle 15 may be in a subsonic to ultrasonic range (50 to 500 m/s). The ejection speed can be appropriately controlled by a flow rate or a kind of the gas to be supplied from the gas-supplying unit 11, by a shape of the nozzle 15, by a length or an inner diameter of the piping 12, by an exhausting amount of the exhausting unit 18, and the like. For example, an ultrasonic nozzle such as a laval nozzle may be used as the nozzle 15. The fine particles in the aerosol that are ejected from the nozzle 15 at a high speed collide to the substrate so as to be fractured or deformed thereby depositing as the structure on the substrate. By changing a relative position between the substrate and the nozzle 15, the composite structure provided with the structure having a prescribed area is formed on the substrate. Specific production conditions such as the pressure inside the chamber and the gas flow rate vary depending on the combination of individual equipment, so that these conditions may be appropriately controlled so far as the structure of the present invention can be formed.

In addition, before being ejected from the nozzle 15, a disintegrating unit (not shown in the drawing) to disintegrate the agglomerate of the fine particles may also be provided. A disintegrating method in the disintegrating unit may be arbitrarily selected so far as the collision conditions of the fine particles to the substrate (this condition will be described later) are satisfied. Heretofore known methods including, for example, mechanical disintegrating such as vibration or collision, static electricity, plasma irradiation, classification, and the like may be cited.

The composite structure according to the present invention can be suitably used, in addition to the uses mentioned above, in the following uses; namely, in an electric car, a touch panel, an LED, a solar cell, a dental implant, a coating for an aerospace industry such as an mirror of an artificial satellite, a sliding member, an anti-corrosive coating in a chemical plant or the like, an all-solid battery, a thermal barrier coating, and high-refractive index uses such as an optical lens, an optical mirror, an optical element, and a jewelry.

EXAMPLES

The present invention will be further explained by the following Examples; however, the present invention is not limited to these Examples.

1. Sample Preparation 1-1 Raw Material Particle

As the raw material particle, yttrium oxide, yttrium oxy fluoride, yttrium fluoride, as well as powders of aluminum oxide and zirconium oxide were prepared. The average particle diameters and the powder states of these powders were as listed in Table 1.

1-2 Coating of the Sample

By using the raw material particles described above and the substrates listed in Table 1, the composite structures, i.e., the samples a to d and f to n, were prepared. A commercially available sample prepared by an ion-plating method was used as the sample e, while other samples were prepared by the aerosol deposition method.

The basic structure of the apparatus used in the AD method was the same as the one illustrated in FIG. 10. The raw material particle of the sample, the substrate, the kind and the flow rate of the gas in each sample were made as described in Table 1, and the ejection speeds thereof from the nozzle were 150 m/s or more. The thickness of the structure thereby formed was around 5 μm in all of them. The structure was formed at room temperature (around 20° C.).

2. Characterization of the Structure (1)

2-1 Average Crystallite Size

The average crystallite sizes of the sample e and the sample c were calculated from the images photographed with the magnification of 400,000. Specifically, by using the TEM images obtained with the magnification of 400,000, the average crystallite size was calculated from the average value of the approximated circles of 15 crystallites.

From the TEM image, the average crystallite size of the sample c prepared by the AD method was calculated to be 9 nm.

From the TEM image, the average crystallite size of the sample e prepared by the ion-plating method was calculated to be 1 nm.

2-2 Porosity Measurement

By using the images obtained from a scanning electron microscope (SEM), porosities of the samples a to h were calculated by the image analysis by means of the image analysis software WinROOF 2015. The magnifications of 5,000 to 20,000 were used. This porosity measurement has been conventionally used as the assessment method of the compactness of the structure.

As a result, the porosities of all the samples a to h were 0.01% or less. The SEM images of the samples a, c, e, f, and g each are shown in FIGS. 12A-12E. As will be discussed later, in these samples whose low-particle generation were different, the difference in the sample structure could not be identified with the conventional porosity measurement.

3. Characterization of the Structure (2)

3-1 Hydrogen Amount Measurement by D-SIMS Method

The samples for the hydrogen amount measurement were prepared by the way as follows. First, two samples each were prepared in all the samples a to c, f, i to k, m, and n. The sample size of 3 mm×3 mm with the thickness of 3 mm was used. Of the two samples each, one was used as the standard sample, and the other was used as the measurement sample. The surfaces 10a of the structures 10 of these samples were subjected to polishing or the like to bring the two-dimensional average surface roughness Ra of each to 0.01 μm. Next, these samples were allowed to leave at the room temperature of 20 to 25° C., the humidity of 60%±10%, and under an atmospheric pressure for 24 hours or more; and then the hydrogen amounts thereof were measured with D-SIMS.

The hydrogen amount was measured by a dynamic-secondary ion mass spectrometry (D-SIMS method) using the instrument IMF-7f (manufactured by CAMECA SAS).

The standard samples were prepared as follows. The assessment sample, the standard sample which is for the assessment sample and has the same matrix components as the assessment sample, a Si single crystal, and the standard sample for the Si single crystal were prepared. Of the two samples of each, one was used as the assessment sample, and the other was used as the standard sample for the assessment sample. The standard sample for the assessment sample was obtained by introducing heavy hydrogen into the sample having the same matrix components as the assessment sample. At the same time with this, the heavy hydrogen was also introduced into the Si single crystal, so that the same amount of the heavy hydrogen was introduced into the standard sample for the assessment sample and into the Si single crystal. Thereafter, the heavy hydrogen amount introduced into the Si single crystal was identified by using the standard sample for the Si single crystal. With regard to the standard sample for the assessment sample, the secondary ion strengths of the heavy hydrogen and of the composition elements were calculated by using the secondary ion mass spectrometry method (D-SIMS method) thereby calculating the relative sensitivity factor. By using the relative sensitivity factor calculated from the standard sample for the assessment sample, the hydrogen amount of the assessment sample was calculated. With regard to other things, the reference was made to ISO 18114 "Determining Relative Sensitivity Factors from Ion-Implanted Reference Materials" (International Organization for Standardization, Geneva, 2003)) as appropriate.

The structure surfaces of each of the measurement sample and the standard sample were vapor-deposited with a conductive platinum (Pt). As the D-SIMS measurement condition, a cesium (Cs) ion was used as a primary ion species. The primary acceleration voltage was made to 15.0 kV, the detection area was made to 8 μmϕ, and the measurement depths were made to three standards of 500 nm, 2 μm, and 5 μm.

The hydrogen atom numbers per unit volume (atoms/cm$^3$) of the obtained samples are summarized in Table 2 to be described later.

3-2 Hydrogen Amount Measurement by RBS-HFS Method and p-RBS Method

First, the surfaces 10a of the structures 10 of the samples a, c, f, and j were polished to bring the two-dimensional average surface roughness Ra of each to 0.01 μm. Next, these samples were allowed to leave at the room temperature of 20 to 25° C., the humidity of 60%±10%, and under an atmospheric pressure for 24 hours or more; and then, the hydrogen amounts (hydrogen atom concentrations) thereof were measured.

The hydrogen amount was measured with a combination of RBS-HFS and p-RBS. As the instrument, Pelletron 3SDH (manufactured by National Electrostatics Corp.) was used.

The measurement conditions of the RBS-HFS method were as follows:
Incident ion: $^4$He$^+$
Incident energy: 2300 keV, incident angle: 75°, scattering angle: 160°, recoil angle: 30°
Sample current: 2 nA, beam diameter: 1.5 mmϕ, irradiation amount: 8 μC
In-plane rotation: no.

The measurement conditions of the p-RBS method were as follows:
Incident ion: hydrogen ion (H$^+$)
Incident energy: 1740 keV, incident angle: 0°, scattering angle: 160°, recoil angle: no
Sample current: 1 nA, beam diameter: 3 mmϕ, irradiation amount: 19 μC
In-plane rotation: no.

The hydrogen atom concentrations thereby obtained are summarized in Table 2 to be described later.

3-3-1 Preparation of the TEM Observation Samples

TEM observation samples of the samples a to n were prepared by the focused Ion beam method (FIB method). First, each sample was cut out. Then, the FIB processing was carried out to the structure surface of each sample. First, the carbon layer 50 was vapor-deposited onto the structure surface of each sample. The vapor-deposition thickness of the carbon layer was aimed at about 300 nm.

After vapor-deposition of the carbon layer, the sample was made thin by using the FIB apparatus. First, the sample was placed such that the side of the carbon layer was up, and then, a Ga ion beam was irradiated to around the portion to be made thin thereby cutting-out the part of the structure of each sample together with the carbon layer. By means of the FIB pick-up method, the structure that had been cut out was fixed to the TEM sample holding plate for FIB by utilizing a tungsten deposition function. Next, the tungsten layer was formed by the tungsten deposition treatment on the carbon layer 50 and the portion to be made thin for the TEM observation. The aimed thickness of the tungsten layer was made in the range of 500 to 600 nm. The structure of each sample was shaved from both sides of the thinned portion thereof by means of the Ga ion to prepare the TEM observation sample. The aimed thickness of the TEM observation sample at this time was made to 100 nm. During the FIB processing, the acceleration voltage was started with the maximum voltage of 40 kV, and finally, the finishing process was carried out with the minimum voltage of 5 kV. By so doing, three TEM observation samples were prepared.

Then, the upper part thickness 90u of the TEM observation sample 90 was confirmed. By using the TEM observation sample and the scanning electron microscope (SEM), the secondary electron image thereof was obtained thereby obtaining the upper part thickness 90u from this secondary electron image. As to the SEM, S-5500 (manufactured by Hitachi, Ltd.) was used. The SEM observation conditions with the magnification of 200,000, the acceleration voltage of 2 kV, the scanning time of 40 seconds, and the image number of 2560×1920 pixels were used. By using the scale bar in the SEM image, the upper part thickness 90u of each of the TEM observation sample was obtained from the average of 5 measurements. The upper part thicknesses 90u of each sample are summarized in Table 1. There is a tendency that when the sample's upper part thickness 90u is more than 100±30 nm, the luminance Sa decreases, and when the sample's upper part thickness 90u is less than 100±30 nm, the luminance Sa increases. In the sample g, the sample's upper part thickness was 138 nm, i.e., larger than the specified range. Therefore, it may be presumed that the luminance Sa is smaller than the inherent value; however, it was confirmed that the luminance value was outside the range of the present invention.

3-3-2 Photographing of the TEM Bright-Field Image

The bright-field image of each sample a to n obtained by the FIB processing was photographed by means of TEM. The transmission electron microscope (H-9500; manufactured by Hitachi High-Technologies Corp.) was used with the acceleration voltage of 200 kV and the observation magnification of 100,000, wherein the digital camera (One View Camera Model 1095; manufactured by Gatan, Inc.) was used with the shooting pixels of 4096×4096, the capture speed of 6 fps, the setting of the image capture mode being the exposure time of 2 seconds, and the bottom mount camera position. The TEM digital white and black image was obtained such that the carbon layer and the tungsten layer which had been vapor-deposited at the time of preparing the sample might be in the same view field.

FIGS. 13A-13J illustrates the TEM images of the samples a to g, i, j, and l, all of which were photographed with the magnification of 100,000. Three TEM images were obtained so as to be continuous in the lateral direction of each TEM observation sample, so that total 9 TEM images were obtained from one sample.

3-3-3 Obtaining the Luminance Value and Calculation of the Luminance Sa by Image Analysis From the TEM bright-field image thus obtained, the luminance value of the image was obtained by using the image analysis software WinROOF 2015. Specifically, as illustrated in FIGS. 13A-13J, in each image G, the luminance-obtaining region R was set such that the region's vertical length dL might be 0.5 μm from the base point which is near to the surface 10a of the structure and that the region's lateral length dw might be almost the same as the image's lateral length Gw of the image G. In each luminance-obtaining region R, the luminance value of each pixel was obtained; and then, this value was relatively corrected on the basis that the luminance of the tungsten layer in the region R is 0 and the luminance of the carbon layer therein is 255. Here, for the luminance value of the tungsten layer, an average value of the luminance values of 10,000 pixels in order continuously from the minimum luminance value in the tungsten layer of the TME image was used. For the luminance value of the carbon layer, an average value of the luminance values of 100,000 pixels in order continuously from the maximum luminance value in the carbon layer was used. The average values thereby obtained were used as the luminance values of the carbon layer/tungsten layer before the correction.

To each of the luminance-obtaining regions R, an average of absolute values of differences of the luminance values after the correction in each pixel was calculated by using a least-square method. The average of the values obtained from 9 TEM images was taken as the luminance Sa. The total area of the luminance-obtaining regions R at this time was 6.9 μm$^2$ or more.

Figure 13A:
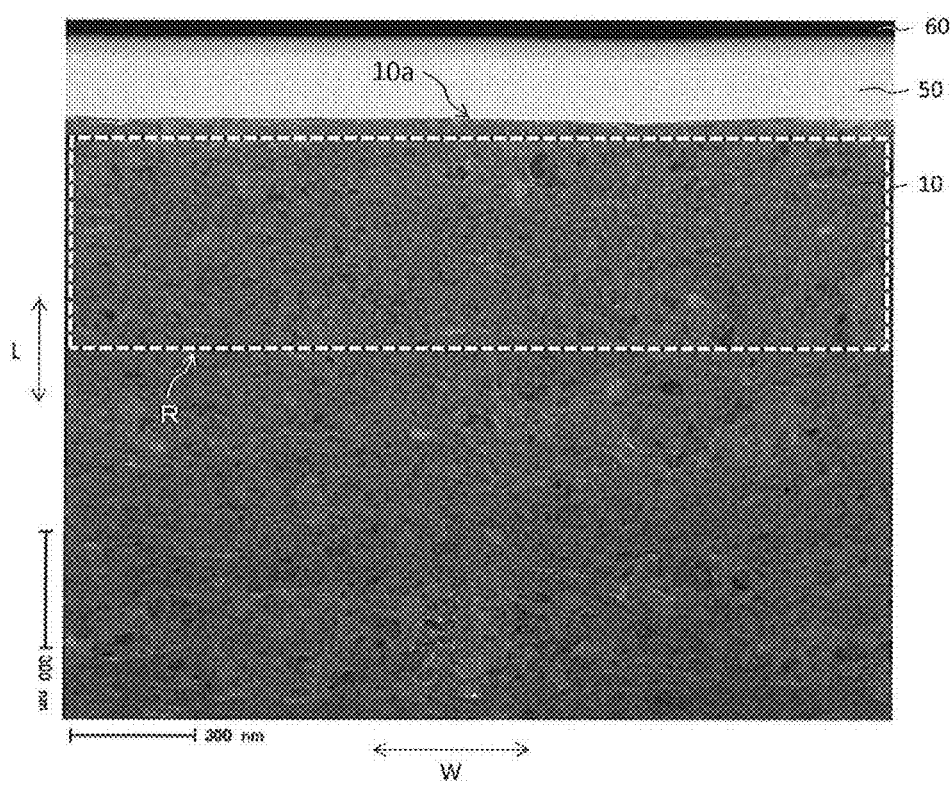
FIGS. 13A-13J illustrate the TEM images G of the structure 10.
Figure 13B:
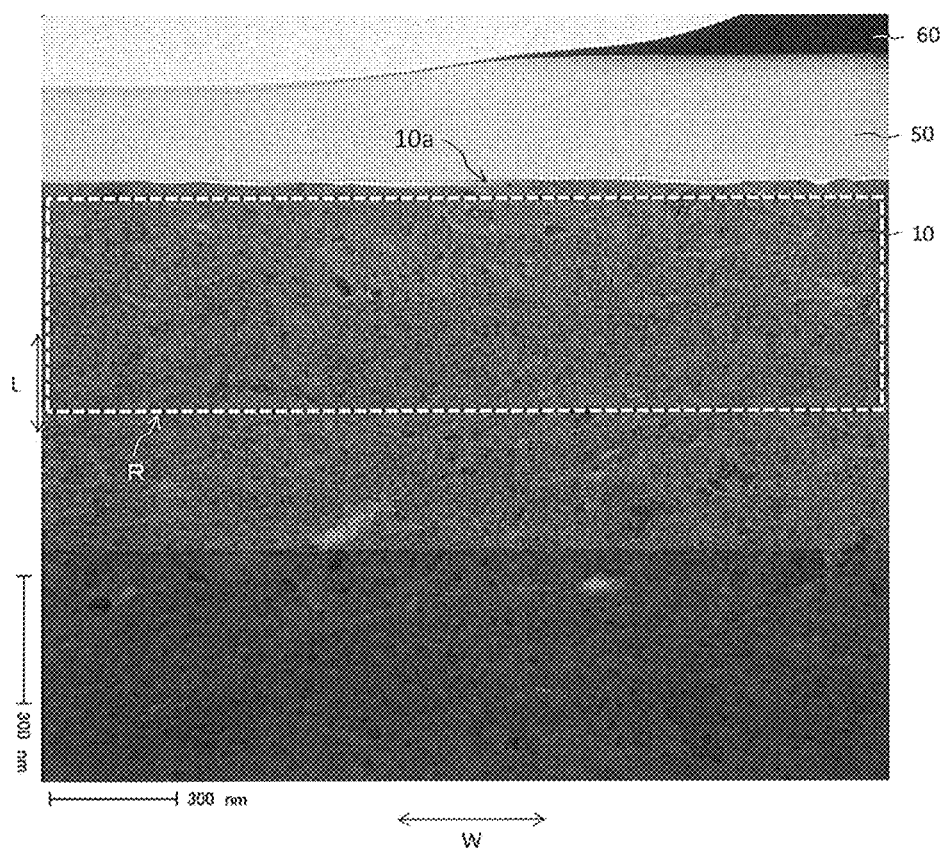
Figure 13C:
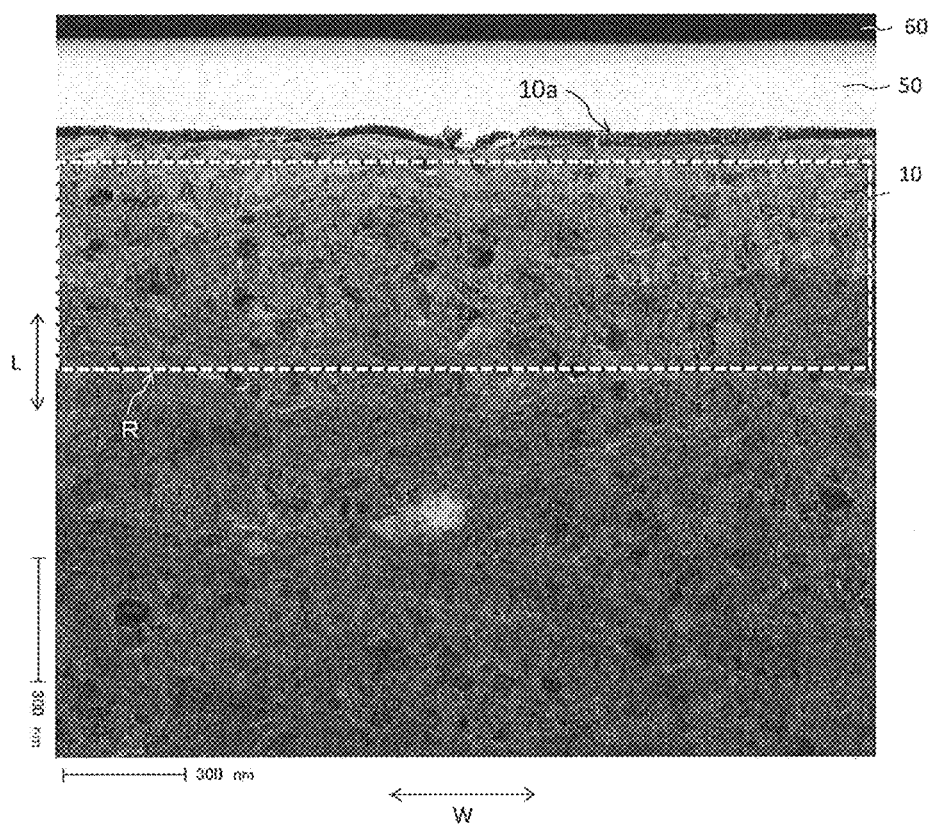
Figure 13D:
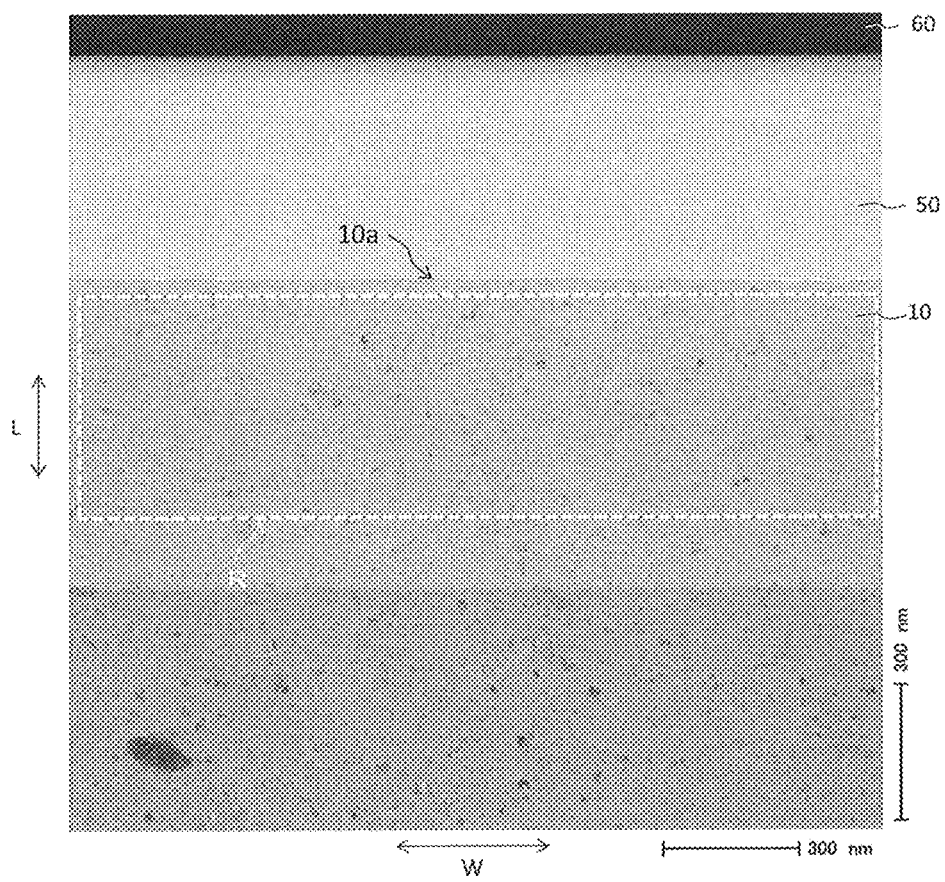
Figure 13E:
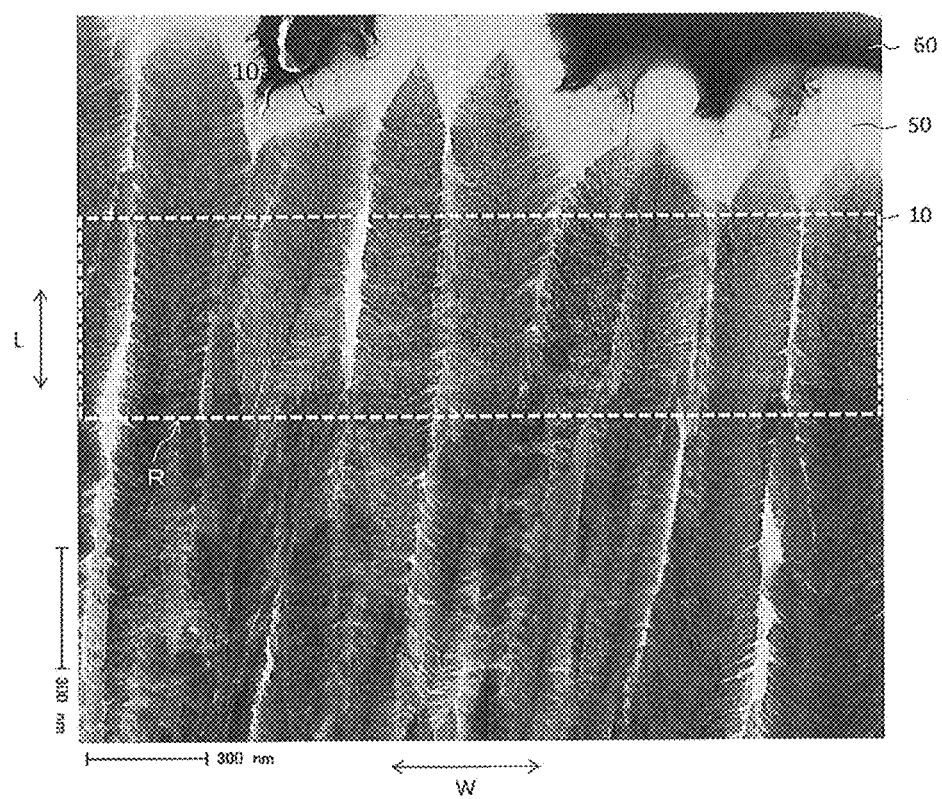
Figure 13F:
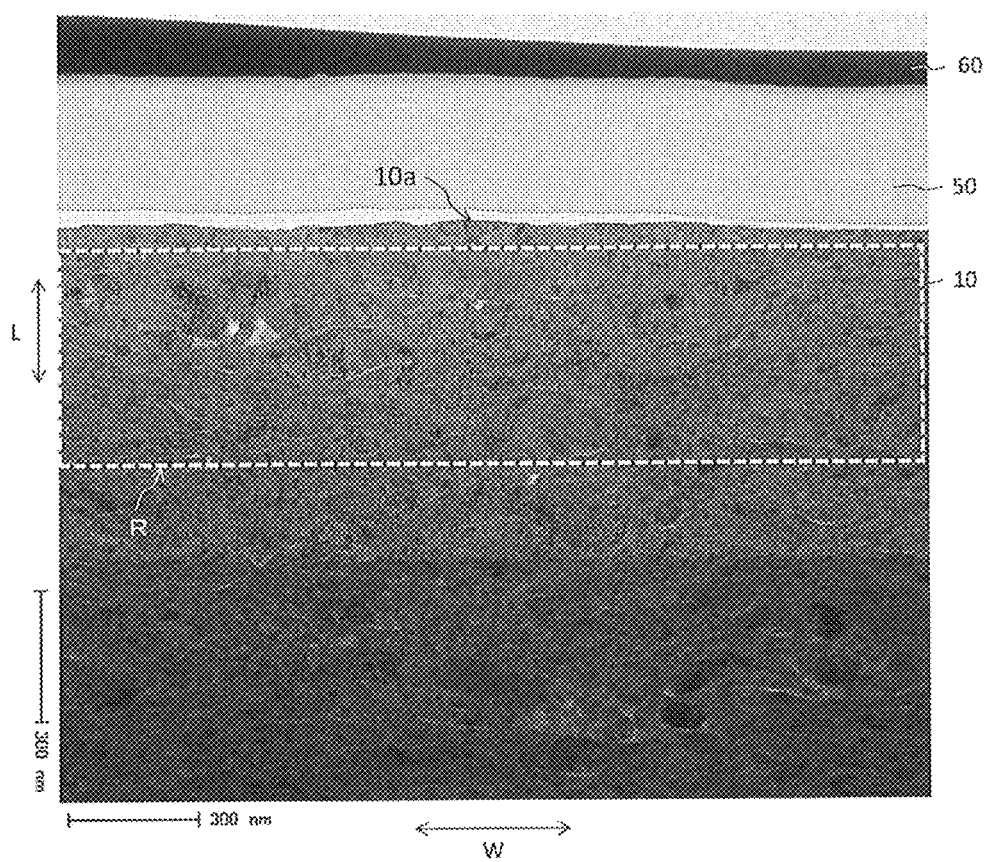
Figure 13G:
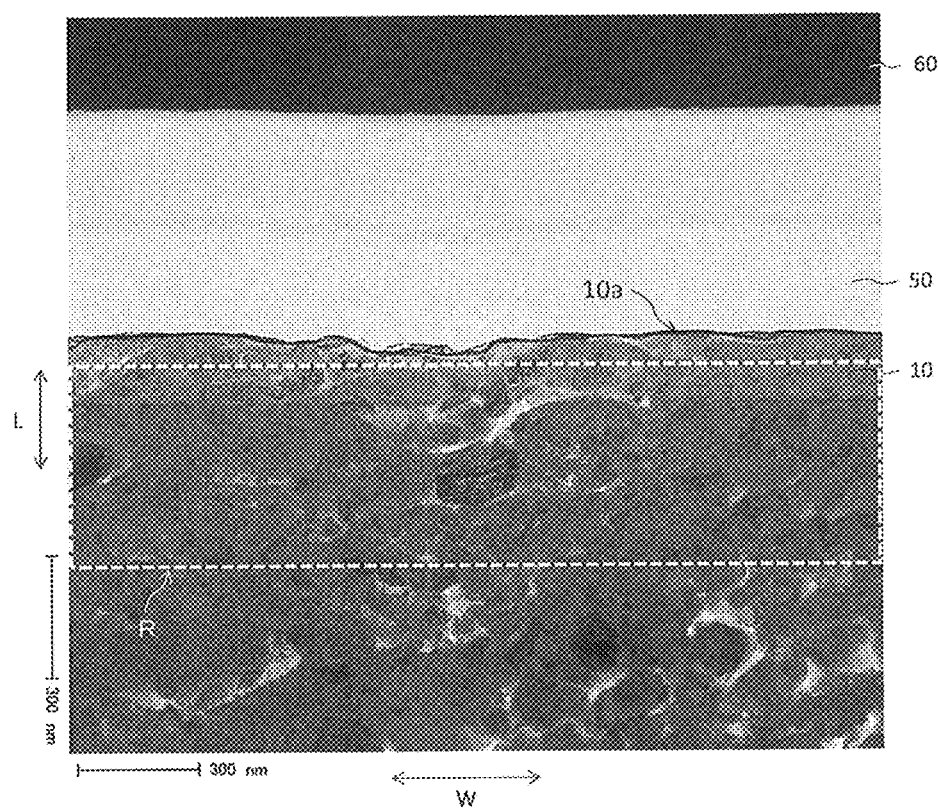
Figure 13H:
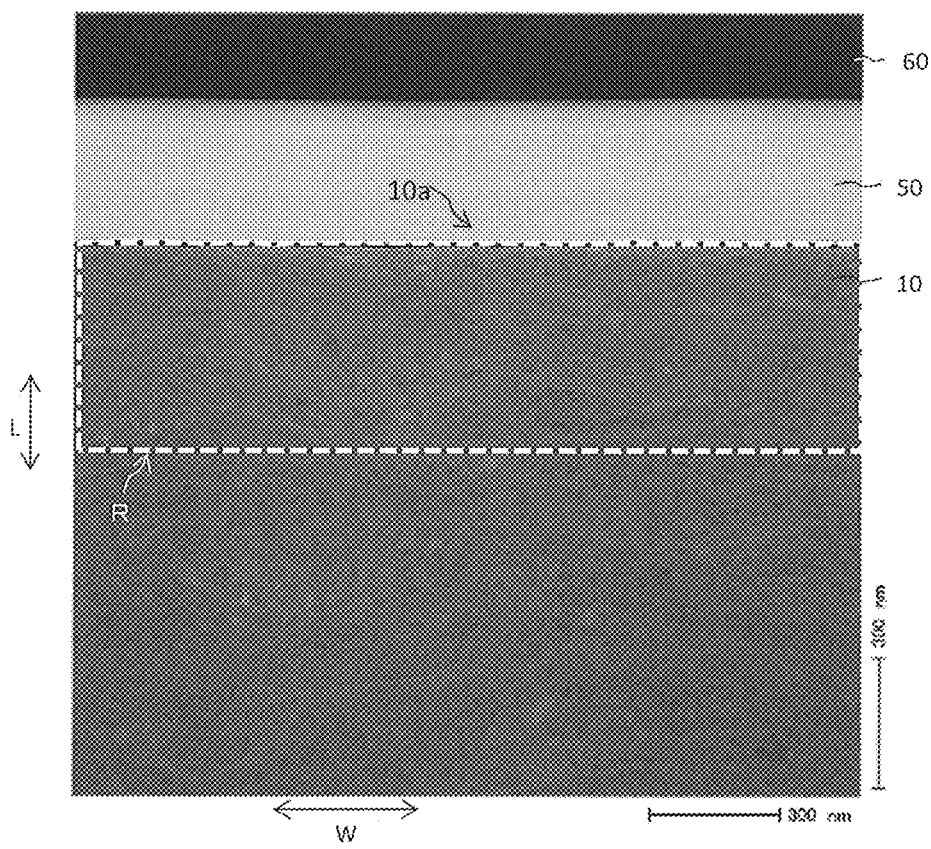
Figure 13I:
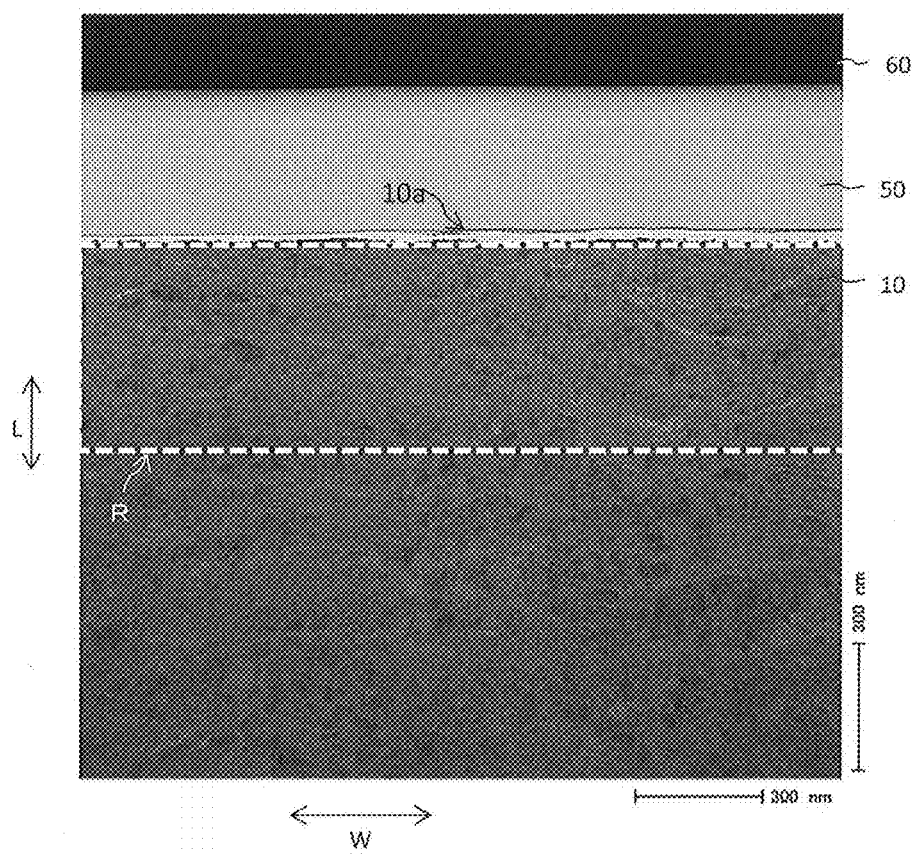
Figure 13J:
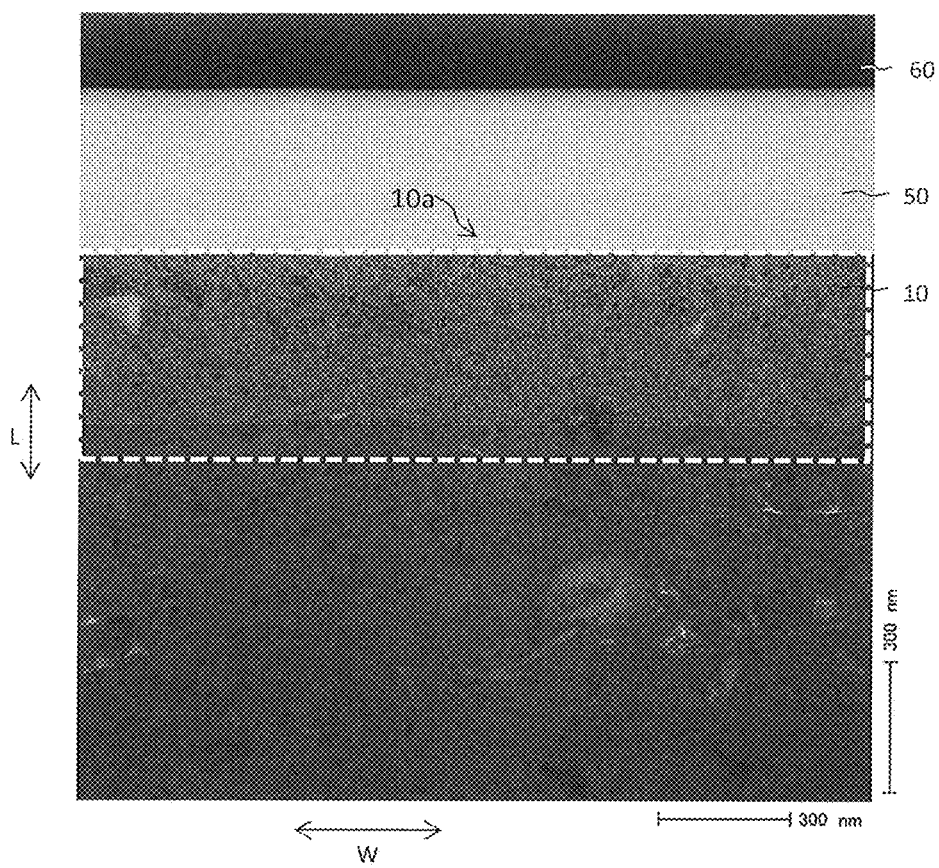
Figure 14G:
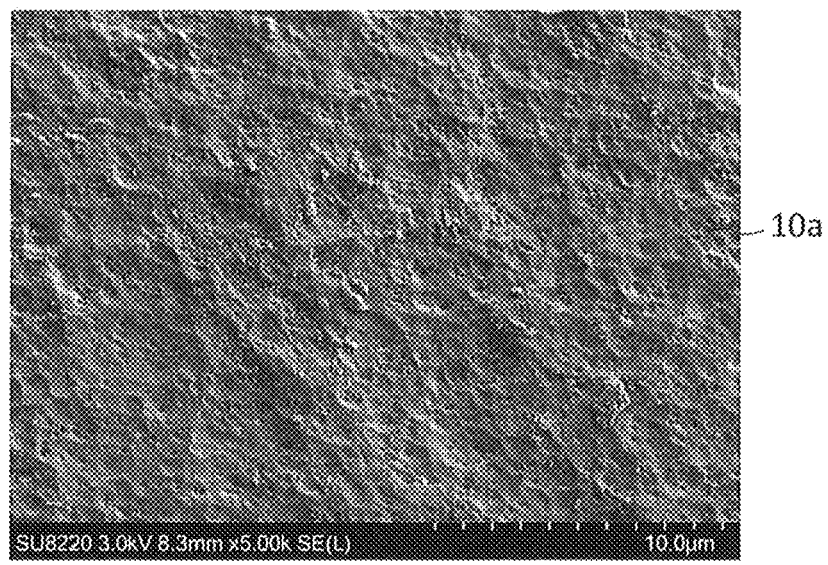

As can be seen in FIGS. 13E, 13F, and FIG. 13G, when the interface between the surface 10a of the structure 10 and the tungsten layer 50 was not linear, the luminance-obtaining region R was set so as to avoid this region. As can be seen in FIG. 13E, when there was an irregularity observed on the surface 10a of the structure 10, the region's vertical length dL was set from the base point which is the nearest to the surface 10a.

The luminance Sa thus obtained are summarized in Table 2 to be described later.

3-4 Calculation of the Luminance Sa with Removing Noise Components

In the step of 3-3-3 Obtaining the Luminance Value and Calculation of the Luminance Sa by Image Analysis, the luminance value of the image was obtained by setting the image analysis software WinROOF 2015 to the removing mode of the noise components.

The luminance Sa thus obtained are summarized in Table 2 to be described later.

3-5 Calculation of Refractive Index

By polishing the surface 10a of the structure 10 of each of the samples a and c, the two-dimensional average surface roughness Ra was made to 0.1 μm or less, and the thickness of the structure 10 was made to 1 μm or less.

The refractive index was measured and calculated by using a microscopic spectroscopy film thickness meter (OPTM-F2, FE-37S; manufactured by Otsuka Electronics Co., Ltd.) and a reflection spectroscopy. As the measurement conditions, the measurement spot size of 10 μm and the measurement wavelength range of 360 to 1100 nm were used.

As the analysis conditions, the analysis wavelength range of 360 to 1100 nm, and an optimization method as well as a least-square method were used. The refractive indexes of each wavelength of the samples are summarized in Table 3 to be described later as well as in FIG. 19.

Figure 19:
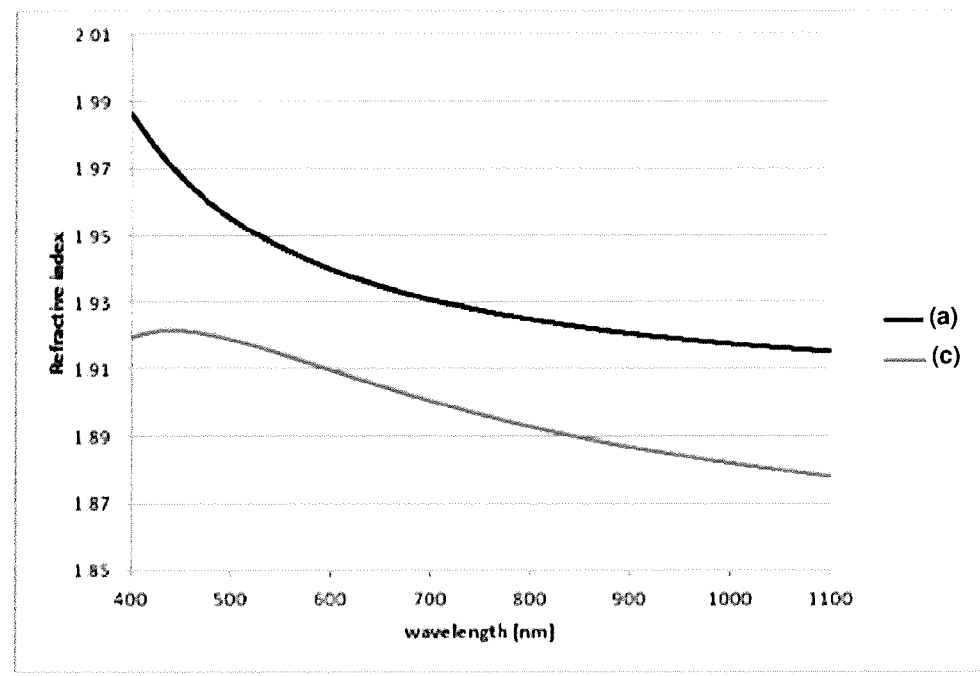
FIG. 19 is the graph illustrating the relationship between the wavelength and the refractive index of the structure 10.

As can be seen in Table 3 and FIG. 19, the refractive indexes of the structures including the Y—O compound according to the present invention were larger than 1.92, which is the refractive index of $Y_2O_3$ known in the past, so that they had high low-particle generation.

4. Assessment of Structure Characteristics
4-1 Assessment of the Plasma-Resistance "The standard plasma-resistance tests" were carried out with regard to the samples a to n.

Specifically in the tests, an inductively coupled plasma reactive ion etching apparatus (Muc-21 Rv-Aps-Se; Manufactured by Sumitomo Precision Products Co., Ltd.) was used as the plasma etching apparatus. The plasma etching conditions with the ICP output of 1500 W as the power output, the bias output of 750 W, a mixed gas of $CHF_3$ gas with 100 ccm and $O_2$ gas with 10 ccm as the process gas, the pressure of 0.5 Pa, and the plasma etching time of 1 hour were used.

The state of the surface 10a of the structure 10 after the plasma irradiation was photographed as can be seen in FIGS. 14A-14M. The SEM observation conditions with the magnification of 5,000 and the acceleration voltage of 3 kV were used.

Next, from the SEM image thus obtained, the corrosion mark area of the surface after plasma irradiation was calculated. The results thereof are summarized in Table 2.

The condition of the surface 10a of the structure 10 after plasma irradiation was photographed by a laser microscope. Specifically, the laser microscope OLS 4500 (manufactured by Olympus Corp.) was used. An objective lens of MPLAPON 100×LEXT (numerical aperture of 0.95, operating distance of 0.35 mm, focused spot diameter of 0.52 µm, and measurement area of 128×128 µm) with a magnification of 100 was used. The λc filter for removal of an undulation portion was set to 25 µm. The measurement was carried out at three arbitrary spots, and the average value thereof was taken as the arithmetical mean height Sa. For other conditions, the international standard ISO 25178 for the three-dimensional surface shape was referred as appropriate. The values of the arithmetical mean height Sa of the surface 10a after plasma irradiation are summarized in Table 4.

Figure 15:
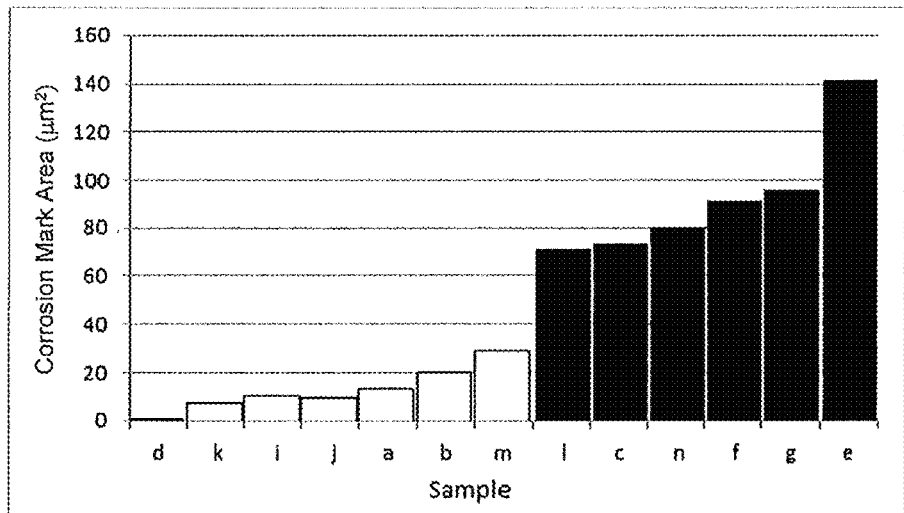
FIG. 15 is the graph illustrating the corrosion mark area of the surface of the structure 10 after the standard plasma-resistance test.

FIG. 15 is the graph illustrating the corrosion mark area ($\mu m^2$) of each sample. As can be seen in FIG. 15, in general, the corrosion mark areas of the samples prepared with the aerosol deposition method were smaller and thus better than the sample e prepared with the ion-plating method.

Figure 16:
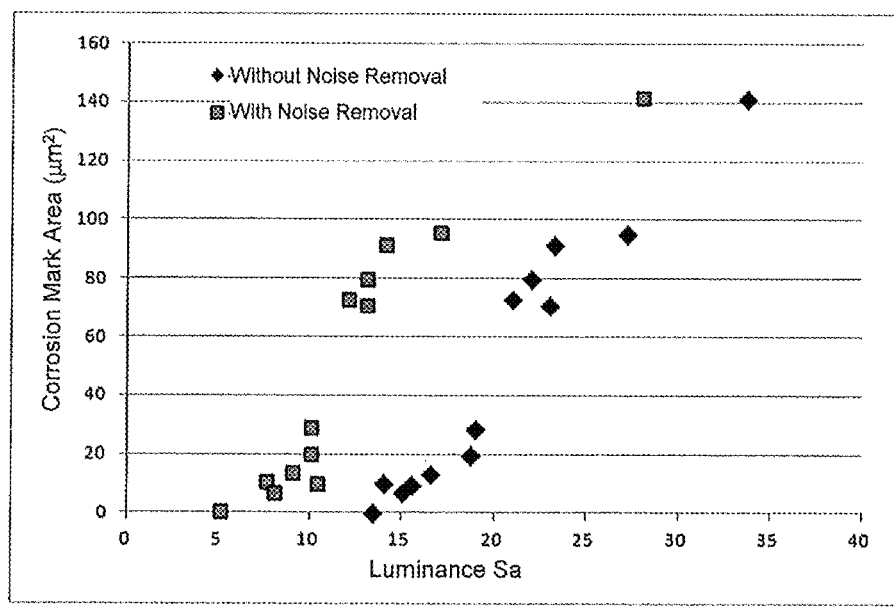
FIG. 16 is the graph illustrating the relationship between the luminance Sa and the corrosion mark area in the surface 10a of the structure 10.

FIG. 16 illustrates the relationship between the luminance Sa and the corrosion mark area ($\mu^2$) in each sample formed with the aerosol deposition method. From FIG. 16, it can be seen that when the luminance Sa is made lower than the prescribed value, the corrosion mark area can be remarkably reduced.

Figure 17:
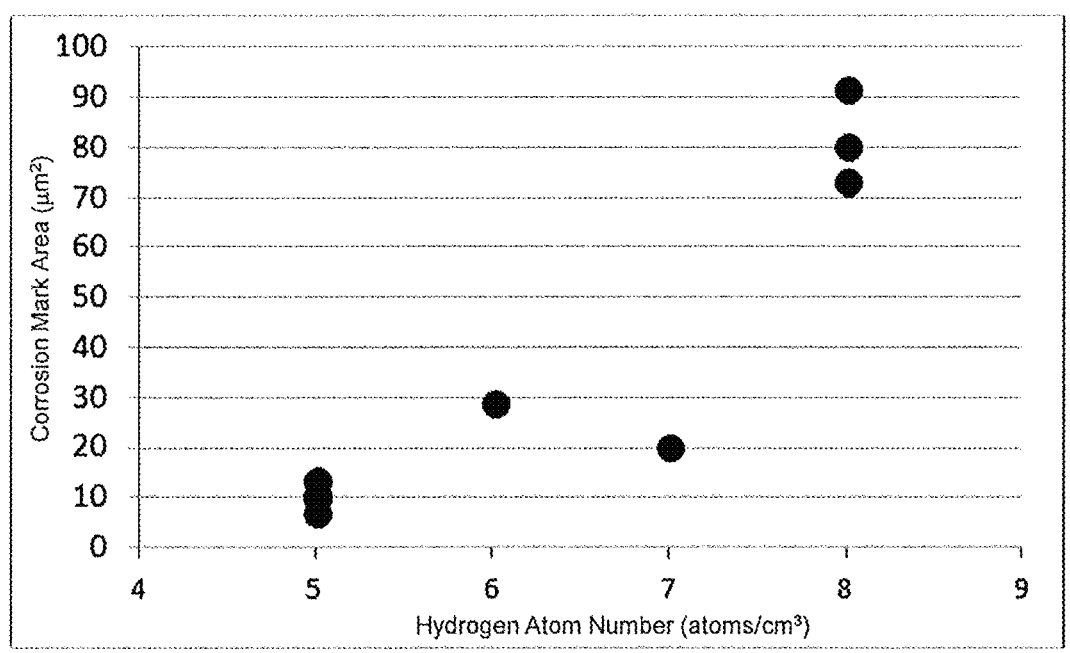
FIG. 17 is the graph illustrating the relationship between the hydrogen amount and the corrosion mark area in the surface 10a of the structure 10.

In addition, as shown in FIG. 17 and Table 2, it can be seen that when the hydrogen atom amount (hydrogen atom number per unit volume/hydrogen atom concentration) of the structure surface is decreased, the low-particle generation can be increased.

TABLE 1

| | Raw material | | Substrate | | Composite structure | Coating condition | | Upper part thickness (nm) | Electric characteristics Breakdown voltage (V/µm) | | |
|---|---|---|---|---|---|---|---|---|---|---|---|
| | Composition | Particle diameter | Material | Ra (µm) | Ra (µm) | Gas | Flow rate | | | | |
| Sample a | Y2O3 | 0.4 µm | Al2O3 | ≤ | ≤ | He | 15 L/min | 105 | — | — | — |
| Sample b | | | | | | He | 7 L/min | 84 | — | — | — |
| Sample c | | | | | | He | 7 L/min | 105 | — | — | — |
| Sample i | | | | | | He | 15 L/min | — | — | — | — |
| Sample e | | | | | | — | — | 116 | — | — | — |
| Sample f | YOF | 1.8 µm | | | | He | 7 L/min | 94 | — | — | — |
| Sample j | | | | | | He | 15 L/min | — | — | — | — |
| Sample g | YF3 | 1.0 µm | Al | | | He | 7 L/min | 138 | — | — | — |
| Sample d | Al2O3 | 0.7 µm | SUS | | | He | 7 L/min | 73 | 164 | 170 | 152 |
| Sample h | Al2O3 | 0.7 µm | SUS | | | He | 7 L/min | — | 120 | 20 | 35 |
| Sample k | ZrO2 | 0.4 µm | Al | | | He | 60 L/min | — | — | — | — |
| Sample l | ZrO2 | 0.4 µm | Al | | | He | 50 L/min | — | — | — | — |
| Sample m | Y2O3-YOF | 0.4 µm | | | | | | | | | — |
| Sample n | Y2O3-YOF | 0.4 µm | | | | | | | | | — |

TABLE 2

| | Luminance Sa | | D-SIMS Hydrogen atom number ($\times 10^{21}$ atoms/cm$^3$) | | | HFS Hydrogen atom concentration atomic % | Evaluation of low-particle generation: Corrosion mark area (µm$^2$) |
|---|---|---|---|---|---|---|---|
| | Without noise removal | With noise removal | @500 nm | @2 µm | @5 µm | | |
| Sample a | 17 | 9 | 5 | 5 | 5 | 6 | 14 |
| Sample b | 19 | 10 | 7 | 7 | 7 | — | 20 |
| Sample c | 21 | 12 | 8 | 8 | 8 | 8 | 73 |
| Sample e | 34 | 28 | — | — | — | — | 142 |
| Sample f | 23 | 14 | 8 | 8 | 8 | 8 | 92 |
| Sample g | 27 | 17 | — | — | — | — | 96 |
| Sample d | 13 | 5 | — | — | — | — | 0.3 |
| Sample i | 14 | 8 | 5 | 5 | 5 | — | 10 |
| Sample j | 16 | 10 | 5 | 5 | 5 | 7 | 10 |

TABLE 2-continued

| | Luminance Sa | | D-SIMS Hydrogen atom number | | | HFS Hydrogen atom | Evaluation of low-particle generation: |
| --- | --- | --- | --- | --- | --- | --- | --- |
| | Without noise removal | With noise removal | (×10²¹ atoms/cm³) | | | concentration | Corrosion mark |
| | | | @500 nm | @2 μm | @5 μm | atomic % | area (μm²) |
| Sample k | 15 | 8 | 5 | 5 | 5 | — | 7 |
| Sample l | 23 | 13 | — | — | — | — | 71 |
| Sample m | 19 | 10 | 6 | 6 | 6 | — | 29 |
| Sample n | 22 | 13 | 8 | 8 | 8 | — | 80 |

TABLE 3

| | Refractive index | | | | | | |
| --- | --- | --- | --- | --- | --- | --- | --- |
| | @400 nm | @500 nm | @600 nm | @700 nm | @800 nm | @900 nm | @1000 nm | @1100 nm |
| Sample a | 1.99 | 1.96 | 1.94 | 1.93 | 1.92 | 1.92 | 1.92 | 1.92 |
| Sample c | 1.92 | 1.92 | 1.91 | 1.90 | 1.89 | 1.89 | 1.88 | 1.88 |

TABLE 4

| | Arithmetical mean height Ra | |
| --- | --- | --- |
| Sample | Before plasma irradiation | After plasma irradiation |
| Sample a | 0.007 | 0.016 |
| Sample b | 0.010 | 0.016 |
| Sample c | 0.013 | 0.023 |
| Sample e | 0.024 | 0.193 |
| Sample f | 0.023 | 0.053 |
| Sample g | 0.022 | 0.068 |
| Sample d | 0.005 | 0.008 |
| Sample i | 0.007 | 0.015 |
| Sample j | 0.011 | 0.019 |
| Sample k | 0.003 | 0.010 |
| Sample l | 0.008 | 0.059 |
| Sample m | 0.004 | 0.016 |
| Sample n | 0.004 | 0.037 |

What is claimed is:

1. A composite structure which is in low-particle generation and is used under an environment in which low-particle generation is required, comprising a substrate and a structure provided on the substrate and having a surface; wherein
the structure comprises a polycrystalline ceramic; and
a hydrogen atom number per unit volume of the structure at a measurement depth of either 500 nm or 2 μm is $7 \times 10^{21}$ atoms/cm³ or less, wherein the hydrogen atom number is measured by a dynamic-secondary ion mass spectrometry (D-SIMS method),
wherein the D-SIMS method is conducted under the following condition that:
conductive platinum (Pt) is vapor-deposited onto the structure surface, a cesium (Cs) ion is used as a primary ion species, a primary acceleration voltage is made to 15.0 kV, and a detection area is made to 8 μmϕ, and
wherein a sample which is the same as the structure surface and a Si single crystal are provided as standard samples, and heavy hydrogen are introduce into these standard samples, and it is presumed that the same amount of the heavy hydrogen is introduced into the standard samples are compared with the structure surface and a Si single crystal into which heavy hydrogen is not introduced, thereby a relative sensitivity factor is calculated, and then by using the relative factor, the hydrogen amount of the structure surface is calculated.

2. The composite structure according to claim 1, wherein the hydrogen atom number per unit volume of the structure is $5 \times 10^{21}$ atoms/cm³ or less.

3. A composite structure which is in low-particle generation and is used under an environment in which low-particle generation is required, comprising a substrate and a structure provided on the substrate and having a surface; wherein
the structure comprises a polycrystalline ceramic; and
a luminance Sa of the structure is 19 or less, wherein the luminance Sa is calculated by a method comprising the steps of:
(i) preparing a transmission electron microscope observation samples of the structure,
(ii) preparing a digital white and black image of a brightfield image of each of the transmission electron microscope observation samples,
(iii) obtaining a luminance value expressed by 256 gradations in color data of each pixel in the digital white and black image,
(iv) correcting the luminance value, and
(v) calculating the luminance Sa by using the corrected luminance value; and
in the step (i),
as the transmission electron microscope observation samples, at least three samples are prepared from the structure,
each of the at least three transmission electron microscope observation samples is prepared by using a focused ion beam method with suppressing a processing damage,
during the focused ion beam method, a carbon layer and a tungsten layer are formed on the surface of the structure for prevention of static charge and for sample protection, and
when a direction of the focused ion beam method is taken as a vertical direction, an upper part thickness of each of the samples is 100±30 nm, wherein the upper part thickness of each of the samples is a length of a short axis direction of the surface of the structure in a plane perpendicular to the vertical direction; and
in the step (ii),
the digital white and black image is obtained in each of the at least three transmission electron microscope observation samples, each of the digital white and black images is obtained by using a transmission electron microscope with a magnification of 100,000 and an acceleration voltage of 200 kV, and includes regions of the structure, the carbon layer, and the tungsten layer, a luminance-obtaining region is set for each of the digital white and black images, wherein the luminance-obtaining region has a region's vertical length of 0.5 μm in the vertical direction from the surface of the structure, and each of the digital white and black images is obtained from each of the at least three transmission electron microscope (TEM) observation samples such that a total area of the luminance-obtaining regions is 6.9 μm² or more; and in the step (iv), the luminance value is relatively corrected by setting a luminance value of the carbon layer to 255 and setting a luminance value of the tungsten layer to 0 to provide the corrected luminance value; and in the step (v), for each of the luminance-obtaining regions, an average of absolute value of differences of the corrected luminance values per each pixel is calculated by using a least-square method, and an average of the averaged absolute values is taken as the luminance Sa, or a luminance Sa is 10 or less, wherein the luminance Sa is calculated by a method comprising the steps of:

(i) preparing transmission electron microscope observation samples of the structure, (ii) preparing a digital white and black image of a brightfield image of each of the transmission electron microscope observation samples, (iii) obtaining a luminance value expressed by a numeral value of a tone in color data of each pixel in the digital white and black image, (iv) correcting the luminance value, and (v) calculating the luminance Sa by using the corrected luminance value; and in the step (i), as the transmission electron microscope observation samples, at least three samples are prepared from the structure, each of the at least three transmission electron microscope observation samples is prepared by using a focused ion beam method with suppressing a processing damage, during the focused ion beam method, a carbon layer and a tungsten layer are formed on surface of the structure for prevention of static charge and for sample protection, and when a direction of the focused ion beam method is taken as a vertical direction, an upper part thickness of each of the samples is 100±30 nm, wherein the upper part thickness of each of the samples is a length of a short axis direction of the surface of the structure in a plane perpendicular to the vertical direction; and in the step (ii), the digital white and black image is obtained in each of the at least three transmission electron microscope observation samples, each of the digital white and black images is obtained by using a transmission electron microscope with a magnification of 100,000 and an acceleration voltage of 200 kV, and includes regions of the structure, the carbon layer, and the tungsten layer, a luminance-obtaining region is set for each of the digital white and black images, wherein the luminance-obtaining region has a vertical length of 0.5 μm in the vertical direction from the surface of the structure and each of the digital white and black images is obtained from each of the at least three transmission electron microscope (TEM) observation samples such that a total area of the luminance-obtaining regions is 6.9 μm² or more; and in the step (iv), the luminance value is relatively corrected by setting a luminance value of the carbon layer to 255 and setting a luminance value of the tungsten layer to 0 to provide the corrected luminance value; and for the digital white and black image having the luminance value corrected, a noise is removed by using a low-pass filter at a cut-off frequency of 1/(10 pixels); and in the step (v), for each of the luminance-obtaining regions, an average of absolute value of differences of the corrected luminance values per each pixel is calculated by using a least-square method, and an average of the averaged absolute values is taken as the luminance Sa.

4. The composite structure according to claim 3, wherein the luminance Sa is 13 or less when a noise is not removed by using the low-pass filter in step (iv).

5. The composite structure according to claim 1, wherein an average crystallite size of the polycrystalline ceramic calculated from a transmission electron microscope image with a magnification of 400,000 to 2,000,000 is in the range from 3 nm or more and 50 nm or less.

6. The composite structure according to claim 1, wherein the average crystallite size is 30 nm or less.

7. The composite structure according to claim 6, wherein the average crystallite size is 5 nm or more and 30 nm or less.

8. The composite structure according to claim 1, wherein the structure comprises a material which is selected from the group consisting of a rare earth element of an oxide, a fluoride, and an acid fluoride, as well as a mixture of at least two of a rare earth element of an oxide, a rare earth element of a fluoride, and a rare earth element of an acid fluoride.

9. The composite structure according to claim 1, wherein the structure has an arithmetical mean height Sa of 0.060 or less after a standard plasma-resistance test.

10. A semiconductor manufacturing apparatus comprising the composite structure according to claim 1.

11. A display manufacturing apparatus comprising the composite structure according to claim 1.

12. A composite structure which is in low-particle generation and is used under an environment in which low-particle generation is required, comprising a substrate and a structure provided on the substrate and having a surface; wherein the structure comprises a polycrystalline ceramic; and a hydrogen atom concentration of the structure is 7 atom % or less, wherein the hydrogen atom concentration is measured by a hydrogen forward scattering spectrometry-a Rutherford backscattering spectrometry (HFS-RBS method) and a proton-hydrogen forward scattering spectrometry method (p-RBS method), wherein the HFS-RBS method is conducted under the following condition that: $^4$He$^+$ions are used as the incident ions with the incident energy of 2300 keV, the incident angle of 75°, the scattering angle of 160°, the recoil angle of 30°, the sample current of 2 nA, the beam diameter of 1.5 mnφ the irradiation amount of 8 μC, and without an in-plane rotation, wherein the p-RBS method is conducted under the following condition that: a hydrogen ion (H$^+$) is used as the incident ion with the incident energy of 1740 keV, the incident angle of 0°, the scattering angle of 160°, and without the recoil angle; and with the sample current of 1 nA, the beam diameter of 3 mn$\phi$, the irradiation amount of 19 μC, and without an in-plane rotation, and wherein the hydrogen amount is calculated from a combination of the ratio of the average atom numbers measured with the p-RBS method and the ratio of the average atom numbers of the hydrogen atom and the element showing the largest detected energy spectrum of the He atom measured with the RBS-HFS method.

* * * * *